(12) United States Patent
Linzell

(10) Patent No.: US 7,921,500 B2
(45) Date of Patent: Apr. 12, 2011

(54) FLEXIBLE FORMED SHEETS FOR TREATING SURFACES

(75) Inventor: Geoffrey R. Linzell, Hatfield (GB)

(73) Assignee: Ball Burnishing Machine Tools Ltd., Hatfield (GB)

( * ) Notice: Subject to any disclaimer, the term of this patent is extended or adjusted under 35 U.S.C. 154(b) by 0 days.

(21) Appl. No.: 12/554,138

(22) Filed: Sep. 4, 2009

(65) Prior Publication Data

US 2010/0199450 A1   Aug. 12, 2010

Related U.S. Application Data

(63) Continuation of application No. 10/568,893, filed as application No. PCT/GB2004/003567 on Aug. 19, 2004, now abandoned.

(30) Foreign Application Priority Data

Aug. 19, 2003   (GB) ................................. 0319425.5

(51) Int. Cl.
 *A47L 7/02* (2006.01)
(52) U.S. Cl. ........................ 15/209.1; 15/210.1
(58) Field of Classification Search ............ 15/97.1, 15/208, 209.1, 210.1, 229.11, 244, 1, 244.2; 428/71, 72, 174
See application file for complete search history.

(56) References Cited

U.S. PATENT DOCUMENTS

| | | | | |
|---|---|---|---|---|
| 1,851,811 A * | 3/1932 | Christie | ...................... | 15/104.93 |
| 4,408,241 A * | 10/1983 | Ogawa | .......................... | 360/128 |
| 5,316,812 A * | 5/1994 | Stout et al. | ................... | 428/64.1 |
| 5,429,854 A * | 7/1995 | Currie et al. | ................... | 428/138 |
| 5,505,747 A * | 4/1996 | Chesley et al. | ................. | 51/297 |
| 5,962,102 A * | 10/1999 | Sheffield et al. | ............... | 428/92 |
| 7,410,683 B2 * | 8/2008 | Curro et al. | ................... | 428/133 |
| 2001/0029966 A1 * | 10/2001 | Wong et al. | ...................... | 134/6 |
| 2004/0022993 A1 * | 2/2004 | Wildeman | ..................... | 428/92 |

FOREIGN PATENT DOCUMENTS

GB   2193133 A   2/1988

OTHER PUBLICATIONS

International Search Report from PCT/GB2004/003567.
Notice of References Cited from U.S. Appl. No. 10/568,893.

* cited by examiner

*Primary Examiner* — Dung Van Nguyen
(74) *Attorney, Agent, or Firm* — Fox Rothschild LLP

(57) ABSTRACT

A surface treatment tool formed from a thin sheet of flexible material, typically a polymer, shaped to store and dispense fluid, scrub, abrade, scrape off and retain debris, including particulates from treated surfaces, and including an array of closely spaced hollow mushroom-shaped protrusions that store (after a bottom sheet which is not shown is added), and then release fluids during rubbing via perforated faces, and upstanding mushroom shapes carrying soft rubbing faces which have harder scraper edges constituting operable faces with gaps between faces leading into a sunken labyrinth into which loosened debris is scraped up and retained.

22 Claims, 8 Drawing Sheets

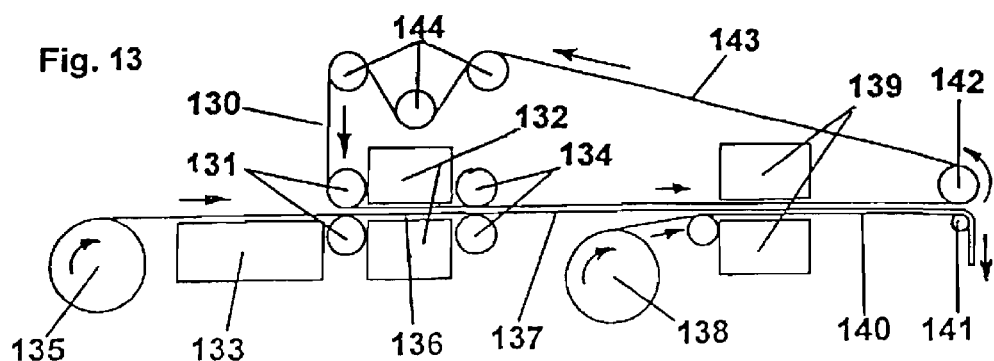
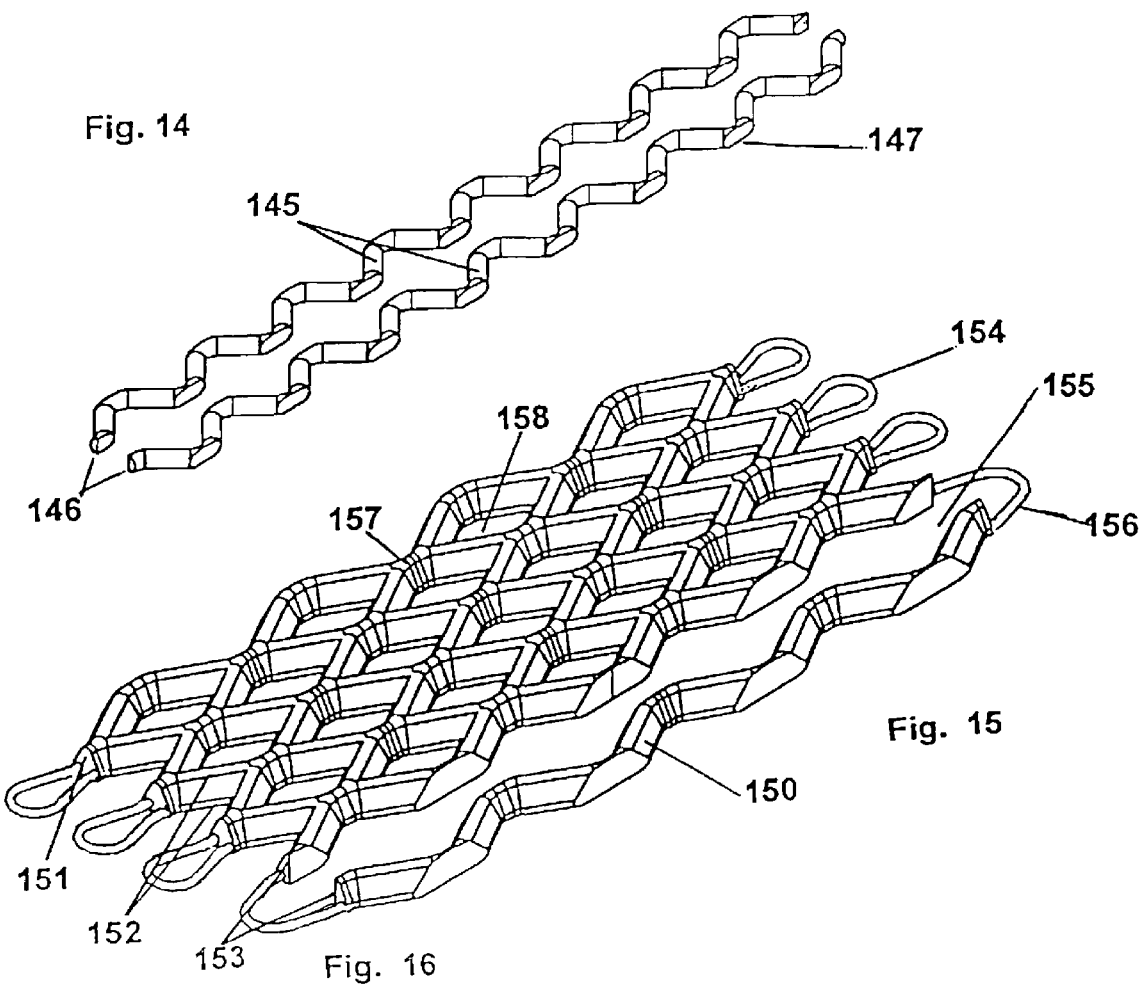

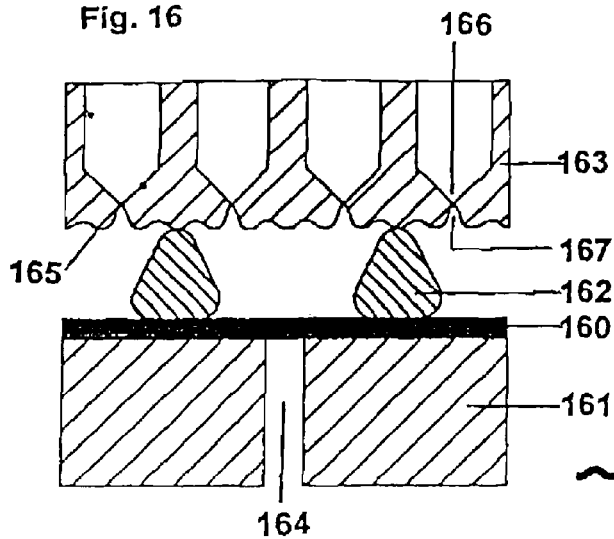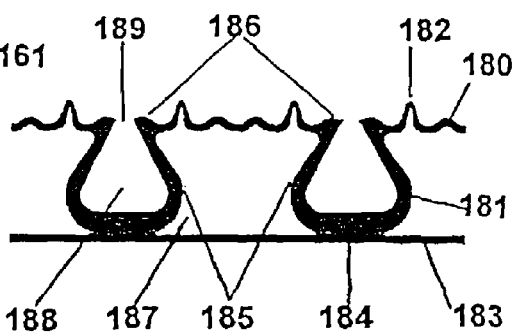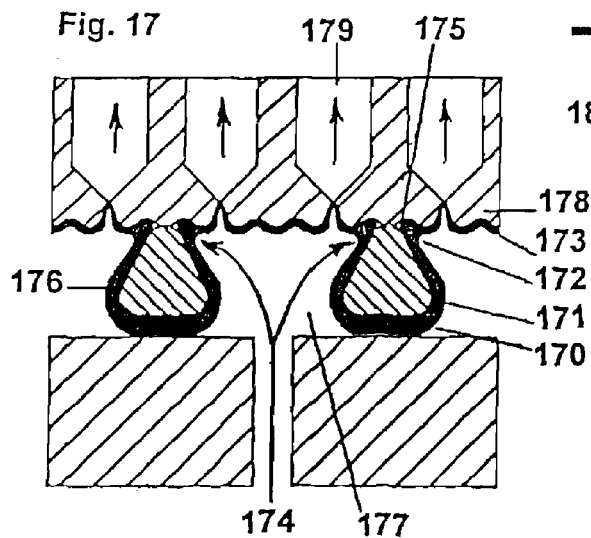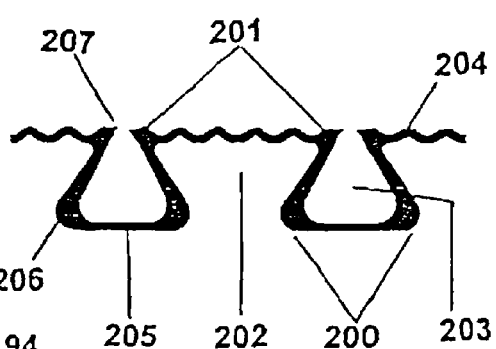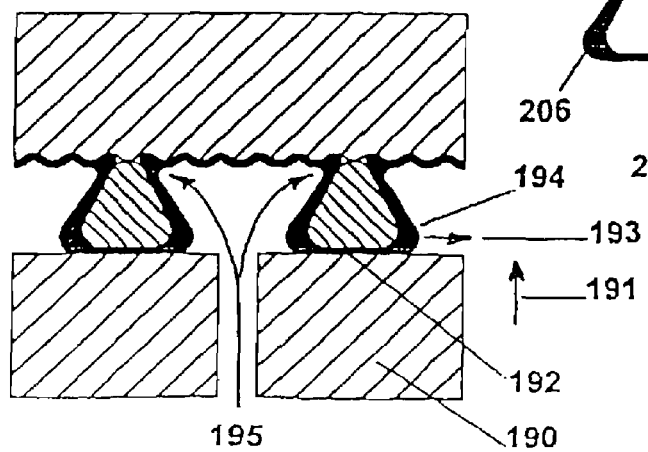

FLEXIBLE FORMED SHEETS FOR TREATING SURFACES

CROSS REFERENCE

This application is a continuation of application Ser. No. 10/568,893, filed Feb. 17, 2006 which is the National Stage entry of PCT/GB2004/003567, filed Aug. 19, 2004, which claims priority from Great Britian Application No. 0319425.5, filed Aug. 19, 2003 the entire disclosures of which are hereby incorporated by reference.

FIELD OF INVENTION

The present invention relates to a layered product for treating surfaces in the form of a flexible embossed sheet of malleable material.

BACKGROUND TO INVENTION

Wipes made with natural or man made fibre in the form of paper tissue, woven and non-woven cloth and combinations thereof are known and used extensively as surface treatment tools for cleaning and drying but they suffer from several limitations that this invention addresses.

An unfortunate property of many fibre-based products is that when wetted they collapse into a dense wet mass and are then difficult to use. In essence, such fibre-based products have a low wet compressive modulus, low bending modulus and low wet resiliency. Generally fibre tools have good fluid absorbency, adequate tensile strength and are soft and flexible. Fibre wipes are useful for removing dirt, for example large clumps of dirt can be individually removed by using the wipe rather like a glove and wrapping it around the clump. At the other extreme wipes are also effective at removing fine dust by entrapment and electrostatic attraction. There is however what might be termed an intermediate size of dirt, larger than air-mobile dust particles but too small to be picked up individually as clumps, which is difficult to deal with using fibre wipes because the particles cannot penetrate between fibres. This intermediate dirt often contains concentrations of particles, like soil or sand, wear debris, grit and crumbs. These limitations are encountered in domestic, institutional and industrial cleaning as well as in personal care cosmetics and medical uses when removing dirt either wet or dry.

Softness, strength, absorbency, bulk and the like have been the focus of improvements of fibre and particularly non-woven wipes leading to denser fibre packing. Efforts to reduce the density of fibre near the surface to facilitate entrapment of dirt at the surface have had only limited success because the dirt is not positively removed from the vicinity of the surface, risking recontamination. Another approach is to make the non-woven wipe with two layers, the operable layer with a plurality of holes into which particulate is expected to collect during rubbing and be entrapped by exposed areas if a tacky layer used also to join the sheets together, the design lacks positive displacement of particulate from the surface an is less than fully satisfactory.

What is needed is a tool with the means of scraping up dirt, either wet or dry and including particulate matter and removing it and storing it away from the surface so that is cannot re-contaminate the surface.

OBJECTIVE OF INVENTION

The objective of this invention is to provide a tool that overcomes some of the limitations of woven wipes in the form of a flexible formed sheet for cleaning and treating surfaces, with a three dimensional (3D) structure that provides means of storing and dispensing fluid, agitating by rubbing (scrubbing) then scraping off, positive removal and retention of scrapped off fluid and dirt within the 3D structure. The flexural modulus of the formed sheet to be unaffected by wetting. The tool to be usable as a stand-alone tool or for incorporation into other tools where it may be combined with other materials.

Approach

To form a tool with a thin sheet of malleable material on which is embossed an array of closely spaced upstanding shapes, the ends of which are flat, these flats comprising the operable face of the tool for rubbing against a surface. The formed shapes providing means of storing fluid therein and dispensing treatment materials there-from, then collecting up and storing used materials into a sunken labyrinth space between embossments within the formed sheet. The formed shapes somewhat resemble mushrooms when viewed from their side because they expand laterally away from their base.

The formed sheet is shaped by plastic deformation and made with metal or polymer films or combinations of these and may incorporate other layers of sheet materials like a flat unformed or formed backing sheet. The formed sheet to be suitable for joining with layers of other materials such as non-woven fibre or foam to extend functionality of tool, either joined side by side or back to back. Since it is possible to isolate the faces either with a dividing or backing sheet or not piercing the formed sheet during shaping, there is provided an option of a moisture barrier between sides, which means two different fluids can be dispensed from the two faces of a single sheet, thus the sheet can be used as a single or double sided tool on which each side is embossed and may be used independent of the other, wet or dry.

Thus the invention is a tool in the form of a sheet that is plastically deformed and shaped symmetrically or asymmetrically from a flat sheet, with an array of protrusions on one or both sides, each obverse protrusion bounding a cavity with its orifice on its reverse side leaving between the protrusions an interlinking void space, a sunken labyrinth running through the formed sheet and accessible from the operable face, onto which formed sheet further layers may be attached.

SUMMARY

A treatment tool comprising a flexible sheet formed to have the shape of a closely spaced array of similarly oriented protrusions having mushroom like cross-sections.

More specifically an alternative definition containing a more detailed explanation of the purpose and function of each feature is:

A surface-treatment tool comprising a flexibly-deformable sheet of material embossed with protrusions, each protrusion with an obverse side that constitutes a raised rubbing element on the face of the tool, and a reverse side bounding a cavity, the sheet being formed to have the shape of a closely-spaced array of similarly oriented hollow protrusions upstanding from either side of the sheet, the protrusions having mushroom-like cross-sections (with heads larger than stems), the protrusion forming cavities opening onto reverse side and being fillable with stuff, such that the heads of the mushrooms comprise the operable face of the tool, while the interlinking space between the mushroom stems forms a sunken labyrinth running throughout the sheet accessible from the operable face and finable with other stuff.

DESCRIPTION

The invention provides a treatment tool for rubbing surfaces with. It comprises a flexible sheet formed (embossed) to have the shape of a closely spaced array of similarly oriented protrusions having mushroom like cross-sections. The shaped protrusions are mushroom like because they taper inversely with the head of the protrusion being larger than the body or stem.

Thus the tool is a formed sheet, made with a thin flexibly (elastically) deformable layer of material that is shaped by plastic deformation, with one or both faces of the tool embossed with arrays of small mushroom like protrusions, the two sides of the tool appearing similar on a double-sided tool, and mirrored (opposite) on a single sided tool. The protrusions are hollow and may be sealed with additional layers forming cavities for storing and dispensing stuff from during rubbing.

Each mushroom head is approximately flat and has a small rubbing face thereon referred to as the obverse face. The mushrooms stand proud of the sheet face and their heads collectively constitute the tools operable face.

More specifically the invention provides a surface-treatment tool comprising a flexibly deformable sheet of material embossed with protrusions, each protrusion with an obverse side with a raised rubbing element and with a reverse side bounding a corresponding cavity.

The tool is formed from a thin sheet, which means that when embossed both sides are deformed by almost equal amounts, but in opposite directions, and a deformation on one side reflects on the other. Thus by embossing a flat sheet a three-dimensional shape is created about the original sheet, which has features designed for treating surfaces. The invention therefore provides a surface treatment tool, a device for treating surfaces by rubbing with an operable face on the tool.

A treatment applied to a surface rubbed by the tool is the result of several complex functions of the tool including: wetting with fluids dispensed from orifices or porous areas on obverse sides or orifices on reverse sides of mushroom protrusions during rubbing, the fluids having been stored in cavities within the mushroom protrusions and are displaced by deformation of the mushroom shapes during rubbing; scrubbing—that is to rub hard so as to clean as a result of the textured roughness of the tool provided by the multiplicity of obverse rubbing faces at the ends of mushroom protrusions; agitation to maximise chemical-mechanical interactions at the wetted area; massage with laterally applied pressure and pummelling with minute oscillatory stick-slip motions due to friction effects between the mushroom protrusions and the treated surface during rubbing; polishing with polishes dispensed from within the tool or applied separately; buffing; abrading as with lapping using compounds containing mild abrasive dispensed from tool the or applied by other means independent of the tool.

In addition to the above rubbing actions, there is a stiff edge around the rim of each obverse rubbing face. The stiffness and hardness of the edge is determined by the nature of the material used to make the tool and it's thickness. The stiff edge provides support for the soft rubbing face. Functionally the edges help to spread freshly applied fluids evenly over a surface to ensure good wetting. As rubbing proceeds the fluids mix with material loosened or cut from the surface which tends to thicken the fluid, perhaps turning it into a paste, which is more easily scraped up with a suitably shaped edge and directed into a labyrinth within the tool body for safe storage. When the surface being treated is smooth like glass or polished marble and the tool is made with a rubbery material, the scraping edges tend to act like squeegees that pile up and lift off used fluid and dirt from the surface to leave it locally clean and dry.

The tool is used principally for treating surfaces to clean and condition them. Treatable surfaces include but are not limited to solids such as metals, plastics, ceramics, glass, leather, skin (human and animal), paper, rubber, fabric, masonry and biological surfaces such as plant tissue. Generally the tool works better on smooth surfaces, but may be useful on some moderately rough surfaces. For rougher surfaces the materials used in the tool need to be tougher and able to resist tearing. As a practical guide the rougher a surface the less effective the tool becomes, for example the tools used in the examples hereinafter are shown to work effectively on average domestic timber floors, but do not work as well on rough sawn timber.

The treatments may be applied wet or dry. Wet treatments may include a passive or active chemical, which means chemicals that either do not or do react with the something. Typical passive treatments include coatings like wax polish or cosmetics that attach onto the surface by weak adhesive forces but do not chemically interact with the surface and change the surface. Typical of interactive chemicals are surfactants used for cleaning that interact with deposits on the surface to release them from the surface. Reactive chemicals such as bases or acids react directly with the surface oxides and substrate and change the surface chemistry. Thus, the preferred chemicals used with the tool are in fluid form and may be passive, interactive (cleaning by not changing the surface chemistry) or reactive (and change the surface chemistry). As it agitates the tool drives chemical-mechanical interactions especially when abrading, for example lapping flat semiconductor wafers.

Another objective and a preferred use is the collection and removal of dry particulate matter like crumbs, sand and soil which are scraped up with appropriately shaped edges and deposited onto a tacky surface within the labyrinth removed from the operable face done with a wet or dry tool.

The invention, comprising a flexible formed sheet must remain sufficiently flexible after forming for it to be used for treating non-flat surfaces.

This requires that the formed sheet is able to bend and return flat. The term 'flexibly deformable material' means it is elastically deformable without breaking both before and after forming into a tool. The elastic nature allows each obverse face with a stiffened edge to align independently planar with the surface being rubbed. Therefore the smaller the mushroom shapes the more flexible the tool. It also means the formed sheet should recover approximately flat unaided following crumpling up, as a guide this means no more than a 20% set after 30 seconds recovery (100% set taken as a 180° fold).

A tool must be flexible enough to follow during rubbing the shape of an average surface being treated, in rugged applications like treating metals the material from which the tool is made must be similarly rugged, and may itself be of metal. Whereas when treating soft surfaces like skin, the tool needs to be of similar softness therefore made with polymers or rubber or a combination thereof. As a guide, the flexibility of a single layer of formed sheet of polymer for domestic cleaning purposes is comparable to a sheet of medium weight dry writing paper of about 80 gm/m$^2$. Because the formed sheet is made with non-absorbent material its flexibility is not affected by wetting in the same way as fibre and foam wipes. Some of the materials used to make the formed sheets may be slightly hydroscopic, but the absorbed water (or other fluids) does not significantly affect their flexibility.

Adding a second and subsequent backing layers to a formed sheet raises stiffness, as a guide the stiffness of a polymer sheet for domestic cleaning, with its cavities filled with fluid, and with a single backing layer might rise from the equivalent stiffness of 80 gm/m$^2$ to 150 gm/m$^2$ dry writing paper.

The tool—a formed sheet may be used as a stand-alone entity or combined with other flexible layers for use on or within a composite tool. It may be used as part of a vertical stack or arranged horizontally, side-by-side in a lateral sheet or inserted into a hole in a flexible sheet of different material or a hole may be made in the formed sheet and filled with another flexible material so that the operable face of the formed sheet is co-planar with the adjacent sheet and the surface when being rubbed. Typical sheet materials that a formed sheet may be inserted into include sheets of non-woven fibre and foam-cloth, all of which have approximately similar dry flexibility to the formed sheet. For completeness the formed sheet may also be used with or attached to articles carrying bristles, where at least the bristles will be flexible.

The flexibly deformable sheet of material is embossed with protrusions each of which is a separate rubbing element with a discrete rubbing face raised above the original sheet face, referred to as the obverse face. Obverse is used here to mean the functional working side of the tool. Thus the obverse side of a protrusion means that the small rubbing face at the end of the protrusion constitutes a working face of the tool, a face for rubbing against a surface. The protrusion also has a reverse side and this means each protrusion being hollow also bounds a cavity on its reverse side.

The sheet being formed to have the shape of a closely-spaced array of similarly oriented hollow protrusions upstanding from either side of the sheet. The term array means a regularly organised pattern, in this case an ordered set of related protrusions, arranged with approximately equal close spacing in x and y planes covering the face on a horizontal sheet, the actual spacing is described later in relation to the manufacturing and use for the tool.

The term similarly is used to emphasise the uniformity of the sheet form, because all the protrusions on one side are pointing or oriented in the same direction. The embossed protrusions stand above the face, hence the use of the term upstanding, leaving space beneath. The direction of embossment is usually in a single direction normal to the centre line of the sheet when viewed edge on, resulting in a tool with an operable face on one side only; or it may be embossed in two directions above and below the sheet centre line in which case the tool has two operable faces. When the embossments are on both sides the arrays are displaced slightly so that four mushrooms on one side surround each cavity opening on the other and vice versa, and this arrangement is called interlacing. Double-sided sheets are also made by joining two single sided sheets back to back, which can also be interlaced. If the direction of embossment is not vertical the tool assumes a directional characteristic, perhaps cleaning in one direction and polishing in another, a useful feature in rotary cleaning pads or floor mops.

The formed sheet is made with flexibly resilient malleable material, which may be either a thin metal foil or a polymer sheet.

A malleable material is one that is adaptable, pliable, flexible and resilient that is formable into a shape by plastic deformation upon applying external pressure differentials, either by pressing as in deep drawing, blowing or sucking as in thermoforming and the choice depends upon the material.

If the material is metal it will have been formed into foil by rolling during which it work-hardens and therefore needs to be annealed before further forming. Materials such as, but not limited to aluminum, steel, stainless, copper and alloys thereof being suitable, the preferred materials being alloys of copper, aluminum or stainless steel. Formed sheets of metal are more expensive than polymers, therefore they are only considered for special uses usually for treating other harder metal surfaces. The principle requirement of the-metal is that it can be conditioned to have a fine-grained crystalline structure suited to deep drawing without it fracturing. The metals must start fully annealed before forming and will probably require to be further annealed after the protrusions are formed and before a second forming stage to converted parallel extrusions into a mushroom shapes as described later.

Cheaper materials for making the formed sheet are polymers that soften and flow upon warming to permit shaping. Polymers with this characteristic are classified as thermoplastics and are preferred for high volume general-purpose tools. Other polymers that cure by cross-linking like a natural and synthetic rubber or epoxy are known as thermoset's and are less suitable for use in this invention unless means are available for shaping these. Thermoset polymers such as heavily cross-linked silicone or urethane rubber may be moulded into shapes similar to the formed sheet and therefore can be used in the invention and are the preferred thermoset materials because of their generally inert nature, and in the case of silicones their high temperature stability. Combinations of thermoplastic and thermo-set materials that do not cross-link are available and have certain benefits as described later.

Many common thermoplastics are considered crystalline but unlike metals are rarely found in a fully crystalline condition. The significance of the crystalline structure in both metals and thermoplastic polymers is that these materials may be deformed and selectively strengthened and hardened as the material is shaped thus imbuing formed sheet of soft polymers with the useful feature of developing significantly stiff shapes with hard edges when thermoforming. Such hardened areas are for use as scrapers, also acting as mild abrasives when cleaning and treating less hard surfaces. These-harder edges being hard enough to lift wetted adhering dirt, yet they will soften during rubbing if friction heating occurs, which softens the hard edge to prevent damaged to the surface, thus they also have a useful non-scratch capability which is a preferred feature.

The comments that follow are provided as a guide to selecting appropriate polymers but it is advisable to consult with industry experts before making a choice because of the wide variety of polymer types and blends available, many of which have proprietary unpublished features that may offer application-specific advantages. It is also important to ensure that the material used to make the tool is compatible with the chemicals to be used with it.

Thermoplastic materials suitable for use in this invention are the flexible-materials mostly developed for packaging. The-physical characteristics of these materials change as temperature rises. Starting with the 'glass' or brittle phase at low often sub zero temperatures and for this invention it is desirable to have a glass transition below 20° C. The next phase is the working range in which the material must be tough and flexible and this should extend beyond the boiling point of water to at least 110° C., followed by an 'elastic phase' which desirably is fairly marrow, ideally in the order of 10° C. only, the material behaving here more like a rubber and therefore are difficult to permanently deform. This is followed by a plastic phase-in which the material is highly formable, because in this phase it melts. The range of the formable temperature should be at least 20° C. and preferably greater otherwise thermoforming can become difficult to control due to local variations of temperature: Beyond the plastic range the materials start to decompose. When thermoforming the sheet it is important that the material retains some strength (resistance to flow) at and beyond the melt point and therefore behaves as a very soft stretchable sheet and this characteristic is referred to as 'melt strength'. This characteristic is rarely quoted and should desirably be greater than 5 cN (centi Newtons).

For low cost applications polyolefins are preferred, an example being polyethylene (PE) a generic material an example of which is detailed in the Examples later herein. PE is probably the cheapest and most commonly available polymer, with a relatively low melt temperature of about 115° C. and a plastic range of about 40° C. and a glass transition temperature of typically −25° C., it is well suited for many uses with this invention especially domestic cleaning. There-are-a-large-family of PE's, the-choice-of blends exceeding-1,000, which can be sub-divided into linear low-density polyethylene (LLDPE) with a quoted density of typically 0.91, low-density polyethylene (LDPE) with a quoted-density of typically 0:92, high-density polyethylene (HDPE} with a quoted density of typically 0.94 and somewhat less flexible than the other types and with a higher potential to crystallise therefore it is better suited to rugged applications. All PE's thermoform well but are difficult to bond with adhesives, neither can they be dielectrically heated for forming or welding without modification and blends are available that overcome this limitation.

Polypropylene (PP) another generic polyolefin is also useful but is only available at a density of about 0.9 but nevertheless has lower water vapour permeability than PE and is therefore provides a superior moisture and oxygen barrier. It is generally tougher and more amenable to adhesive sealing and has a higher melt point in excess of 165° C. and a plastic range of about 50° C. but has less good melt strength and therefore does not thermoform as well as PE unless it has been modified with additives to improve melt strength. There are available proprietary blends of PP suited for use herein.

PP and PE are blended together and said to form interlaced structures and these were found to thermoform better than PP alone being less brittle after forming. A specific material type is described later in the examples.

Co extruded versions of these materials are available in which a second material with polar molecules is attached to either PE or PP to enable them to be dielectrically heated. An example of this are the polyvinyl chloride (PVC) family of materials, which also melt at about 165° C. and are highly suited to dielectric heating for thermoforming with PP.

Examples of other polymeric materials which may be thermoformed into formed sheet include, but are not limited to, polyester (PET), polyurethane's (PU), water-soluble polyvinyl alcohols (PVA), compostable or biodegradable polymers, heat shrink polymers, metallocene catalyst-based polymers, thermoplastic elastomers blends (TPE).

A TPE hybrid materials in the form of Thermoplastic Urethanes (TPU) has attractive features—this being quoted at a higher density of 1.2 although confusingly it has rather high permeability but are attractive for its dielectric heating properties and hardness (stiffness) quoted as typically 80 to 85 on the shore A scale. Formed sheet made with TPU proved very durable and soft to touch with significant elasticity and always recovered their original form after severe crumpling during use and are preferred for applications where scraping is unacceptable since there was no evidence of densification or crystallisation thus no hard scraping edges were formed with TPU's.

TPE's are useful for treating soft surfaces like biological surfaces such as living tissue because are very soft to touch and yet grippy contact feel.

The Poly [styrene-(block)-ethane-co-butane-(block)-styrene) (SEBS) materials are amenable to formulation manipulations that provide a wide range of Shore hardness from 30 A to 90 A. These materials have soft touch dry tactile feel. In the lower range 35-50 A are suited to treating biological surfaces like leaves or bark and delicate surfaces. Mid hardness range 50 A to 70 A are of practical use for cosmetic and personnel care wipes. The elastic characteristic enables the rubbing pads to stretch apart during use and thereby enable larger particles to penetrate the apertures between them. An example of this sort of material with a Shore hardness quoted at 50 A is Dynaflex (trade mark) D3202-1000-03 supplied by GLS Corporation of 833 Ridgeview Drive, McHenry, Ill. 60050 USA.

Improved chemical compatibility for use in more specialised medical and industrial uses is provided by thermoplastic vulcanised materials (TPV) or thermoplastic natural rubber (TPNR) which is produced by blending natural rubber with PP and the material is thermoformed at temperatures similar to PP. TPV is partially vulcanised dynamically during blending whilst TPNR is said to have no cross-linking of the rubber. The TPNR with higher natural rubber content is the softer product. Both have the processing characteristics of a thermoplastic material and functional properties of a vulcanised rubber. Hence both materials are thermoformed on the same tooling as used for PP and PE, but the formed sheet product behaves like vulcanised rubber. TPV and TPNR materials are preferred for medical uses. An example of these are the 8000 series Santoprene (registered trade mark) thermoplastic rubbers supplied by Advanced Elastomer Systems, an Affiliate of ExxonMobile Chemicals, 388 S. Main Street, Akron, Ohio 44311 USA, which materials are said to be USB class 6 compliant and this means they are approved for use with exposed traumatised bodily tissue and fluids in the USA. The same company supplies a product with superior low gas permeability called Trefsin (registered trade mark), which has lower permeability and therefore is superior for long term shelf storage when storing fluids within the cavities of the formed sheet. Generally materials with Shore hardness in the range 50 A to 60 A are preferred for treating sensitive skin and cleaning wounds with a soft touch yet stiff enough wipe action to remove dirt from a wound in an antiseptic environment, the antiseptic dispensed from the cavity by rubbing.

Most of the above mentioned materials are to some extent permeable to gases. Since the cavities within the formed sheets may be used for fluid storage some mention on the use of Barrier Layers within sheets that are not permeable to low molecular weight fractions may be helpful. Polymer barrier sheets are usually co-extruded multi-layer sheets with one thin dense layer that is impermeable. These are generally difficult to thermoform because the dense barrier layer is stiff and may not be plastically deformable. A practical solution is to encapsulate a formed sheet into sealed sachets made with barrier film and use a peel off lid employing seal technology akin to that used for peel off food container lids—such as used on yoghurt pots, an example of which is illustrated later herein. In the case of domestic cleaning fluids a PP blend can usually be found that provides a sufficiently low permeability for a one-year shelf life when storing a typical hydrated blend of cleaning fluid.

In some cases the formed sheet may be suited to retaining or acquiring during rubbing a static electric charge that attracts and retains dust. Polyethylene terephthalate polyester (PETP) is a common thermoplastic polyester and is often called just "polyester" and can assume considerable dipole polarisation. This material is available in many proprietary forms; with a density of 1.3 to 1.4 it also has useful barrier layer features with some limited thermo-forming capability although the thermo-forming window is small. However, when co-extruded with PE it is potentially useful for use in the formed sheet tool of this invention, and able to carry an electrostatic charge.

The formed sheet, the term 'sheet' used herein means a thin flat flexible layer typically ranging in size from roughly 100× 200 mm up to, but not limited to 200×300 mm, in other words ranging in size from roughly half to a full sheet of writing paper or larger. The convention used to describe thin materials can vary. For example a thin polymer on a roll may be called a film, and is more often called a sheet after cutting a piece off a roll, which is what is meant by the term 'sheet' used herein. For completeness thin sheets of metals are normally referred to as 'foils' and are 'coiled' onto a roll. Once parted off thin flat metals are referred to as 'shims' when small or 'sheets' when larger and these are the meanings attributed to these terms herein.

Polymer sheet suitable for use with this invention are usually cast for PP, TPV and TPU materials. They may be extruded in what is referred to in the industry as a 'blown' film process that bi-axially conditions the sheet after it is extruded, which process tends to be used for very high volume production of generic PE sheet up to about 0.1 mm thickness. Sheet thickness for forming a tool herein depends upon end use and may range from 0.05 to 4 mm, the thickness for processing polymer by blow moulding to make the tool is in range from 0.1 to 2 mm thick and 0.2 to 0.8 was preferred to give the desired flexibility with materials like PE, PP, TPU and TPV.

The protrusions have mushroom-like vertical cross-sections with heads larger than stems. The term mushroom-like is used here to describe a shape viewed in cross section, which is narrower at its base (it's point of attachment onto sheet) or some part of its stem than at the apex or the head. Put another way the area of its obverse rubbing face is larger than the area of a horizontal cross section of some point of its stem. The shape of the obverse face and stems of the mushrooms may vary between circular and rectangular, the preferred shape is rhombic. Obviously rectangular mushrooms do not occur in nature but a rectangular shape may have a mushroom shape if sectioned vertically and that is what is meant by the use of the term mushroom-like.

During forming a polymer is stretched, which orientates a proportion of the molecules (thought to orientate between 30 and 60% of the molecules within materials like PE and PP) in the same direction and this stiffens the material because the spacing between molecules within the sheet is reduced.

The head shape of the mushroom-like form may be flat or slightly domed with either gently folded edges that remain soft or a very tight fold, in which fold the already orientated material is further compressed and its density rises due to a second change in molecular arrangement thought to create a close packed or near fully crystalline localised volume. The crystallisation phenomenon is known to occur in polymers such as the preferred olefins. This closer molecular packing within a small band around the periphery of the mushroomed head gives a stiffer and harder edge. If it is shaped to have a sharp extremity at its edge for scraping this will also shear off soft projections. On PP tools the hardness and sharpness of the edge is sufficient to shear human skin and hair, especially when the rubbing face is embossed with radial micro roughness pattern, that creates a saw tooth edge.

The operable face comprises closely-spaced shaped protrusions each with a small flat face that acts as a rubbing pad, whose soft face can be further embossed with micro roughness, either random or patterned to provide a micro texture for improved working of a surface. This roughness preferably being a radial pattern, like a wagon wheel with roughness marks running in the direction of flow of material during forming to minimise resistance to flow.

If the rubbing face of the mushroom is flat (without embossment) the polymer is thought to biaxially relax somewhat during forming while the material at its rim densifies and hardens. But if the rubbing face is embossed with micro roughness it stiffens and hardens the face. Small cone shapes may be embossed at the same time, these become brittle and break off during rubbing to provide porous face. This effect is used in both PE and PP.

LDPE forms a less hard edge than PP and TPU and TPV showed no edge hardening due to material change, only stiffening due to the folded edge that acts like a folded beam and thereby tends to resist buckling.

The protrusions forming cavities opening onto the sheet's reverse side and being finable with stuff, the stuff is most often fluid, usually a liquid but may be air, occasionally it may be a solid or a semi-solid in the form of a wax, or a foam or fibre mass that is itself soaked in a fluid or for soaking up a fluid. The advantage of the cavity is first and most significantly to provide storage for materials for use in treating surfaces; second to provide sealed airtight resilient pockets that act as buffers during rubbing; third occasionally to store collected up dirt when the formed sheet is formed double sided. The word dirt is understood to include particulate matter, slime, sludge, dust and the like.

The nature and function of materials stored within the formed sheet, the treatment tool depends upon the intended use for the tool. The preferred areas of use of the tool are domestic, institutional and general cleaning, industrial processes, cosmetics and medical uses. Preferred materials stored within and dispensed from the tool are fluids for domestic and other general cleaning such as; soaps, detergent, solvents and rinses usually but not exclusively blended with water and water alone. For cosmetic uses and skin treatments typical materials stored are; liquids, ointments, waxes, pastes, creams and lotions used for example as make-up bases, moisturizers, sunscreens, proprietary conditioners such as anti-wrinkle creams and cellulite treatments. A use for the tool being the removal of old make-up, while gently exfoliating and cleaning with a hydrolysing cleaning fluid. For medical use antiseptic fluid or creams are dispensed while cleaning and dressing open wounds, traumatised skin or areas adjacent to muscular strains. Dermal anaesthetics may be incorporated for release as appropriate during gentle massage, especially useful for treating sports injuries on site. Typical dermal treatments for skin disorders are for dermatitis or acne employing proprietary formulations and the application of predefined doses of drugs dispensed from the cavities onto the skin then rubbed into the skin for trans-dermal adsorption. For industrial uses the fluids stored may be organic or inorganic and not limited to; acids, bases, solvents, surfactants, release agents, adhesion promoters, lubricants, anti-lubricants including siloxanes, primers and corrosion inhibitors.

A second layer (sheet) may be added to the first layer, the formed sheet. In its simplest form this second layer is a flat sheet that seals off the openings into cavities on the reverse side of single sided tools. The second layer may be joined to the formed sheet around the periphery of the formed sheet or around the periphery of individual cavities within the formed sheet or some combination thereof.

A second layer may be a sheet of non-reticulated absorbent foam. The layers held together by welding, adhesive or mechanical means such as interlocking or folding, for example when formed sheet is formed by two stage pressing, extra layers may be added by placing them over protrusions prior to being converted into mushroom shapes. More than one of the afore mentioned means of attachment may be used when attaching a extra layer. A further layer may also take the form of a foam layer within the labyrinth.

As already noted the rubbing faces on the heads of the mushrooms comprise the operable face of the tool. Depending upon the function of the tool, each rubbing face may require means of slowly releasing stuff, therefore the face must either have an orifice or be porous to facilitate the slow release of stuff, usually a fluid, but may be wax or dry powder stored within the cavity, in which case a much larger orifice may be needed. There are several options for means of release of stuff, for example there may be an open-able orifice in the mushroom head, opened by peeling off a cover held in place by pressure sensitive adhesive; or by forcing stuff through a pre-cut split that is made when filling the cavity with a hypodermic and the split then held closed by residual stress in the head; or the porosity may be the result of a pattern of tiny preformed pin holes that are small enough to retain the fluid by surface energy effects under normal quiescent conditions, but upon rubbing the sheet deforms and pressure rises in the cavities sufficient to force fluid out through the small holes. The dispensing rate of the fluid determined by the viscosity of the fluid, the size and number of holes and the applied pressure. When the materials allow, an embossed micro-texture may including micro points as mentioned earlier, these are tiny cones that are easily fractured during initial rubbing to leave a porous surface. Obviously micro-cones could be embossed without any other roughness if desired. Thus micro porosity cones may be introduced during the shaping/forming operation, where the materials can be locally embrittled by crystallisation due to work hardening.

If the tool is double sided and if the mushrooms are interlaced so the cavity orifices are located between mushrooms on the opposite side then the inverted mushrooms may dispense via their openings.

In practice a treatment and cleaning article employing the formed sheet benefits from the shape and behaviour of the formed protrusions by for example providing an array of small pumps during rubbing, either pumping out (dispensing) when compressed or deformed by shear forces or sucking up after the deformation is relaxed as they recover their shape after rubbing.

In the case of single sided formed sheets the cavities in the reverse side may be left open and filled with absorbent foam or fibre that is either left dry or soaked with fluid, depending again on the function of the tool.

A means of filling closed off cavities on single sided formed sheets with low viscosity fluid was first to seal off individual protrusions on the reverse side with a flat backing sheet then welding in place or pressing a contact adhesive treated back sheet over the reverse side; then pierce each mushroom rubbing face with an hypodermic and fill the cavity. The hypodermic hole optionally covered with a peel off contact adhesive or left closed under residual stress. Alternatively for high volume production it is beneficial to form or invert single sided sheet so that cavity openings face upwards and fill them en bloc before attaching a backing sheet.

As already explained some parts of the sheet are extruded into protrusions, leaving a space between protrusions. Therefore the sheet material between the protrusions remains substantially unformed leaving a flexible web of material, which is a preferred feature because it ensures the sheet per se remains flexible after forming.

The flattened heads of the mushroom shapes arch over the unformed web area to semi enclose it and if desired fully enclose this space, referred to hereinbefore as the labyrinth space running between the mushroom stems. If fully closed, the over arching heads open during rubbing due to lateral forces on the flexibly deformable mushrooms to allow material to enter.

The web therefore has a sunken or sub-face face that is the floor of an interlinking labyrinth running throughout the formed sheet. The faces within the labyrinth can be treated with traces of tack, a wax like oily sticky substance rather like that use on fly catchers to help capture and hold dirt and used materials displaced off the surface by the scraping action of the obverse rubbing faces during rubbing. A preferred feature is the labyrinth space being accessible from the operable face and finable with other stuff (dirt) scraped off the surface by the edges of the mushroom shapes.

Several methods of thermoforming sheet for this invention were investigated all employed a pressure differential to force a warmed sheet of polymer through an aperatured body. The first described in our priority filing involved a mechanical press to extruded by deep drawing a conditioned (bi-axially stretched) sheet of pre-heated polymer sheet between warm forming rolls and dies. This is referred to hereinafter as pressform. The forming tools indent the sheet from one or both sides thereby forming precisely sized protrusions bounding well-defined individual cavities formed on one or both sides. The indentations are most often-circular blisters or bubbles, but may also be cone or egg shaped but and can be hexagonal, triangular or rectangular pyramids, preferably all with a rounded apex.

An alternative is to press and index with a tooled die-set in place of the roll and this produces more accurate protrusions with deeper draw and this was the method used for forming metal foil. Vacuum forming was found to be an alternative to press forming polymers and used for first stage of the two-stage thermoforming of circular mushrooms in polymer materials.

The sizes of the mushroom like protrusions are determined by a combination of practical manufacturing limitations and the purpose of the tool. The preferred sizes for large tools for treating rough surfaces or dealing with spillages the mushroom diameter range from 40 mm for circular mushroomed faces, down to 1 mm for special cosmetic uses, medical and industrial use. The upstanding heights will vary, with typical ratio of 5:1 width to height. Rhombic shapes have similar dimension range with 40 mm as the largest diagonal face dimension ranging down to about 1mm, with similar width to height ratios, the preferred heights being in the range 0.2 to 8 mm.

A layer added between thermoforming operations on press and vacuum formed sheet may stiffen the base of the protrusions before the mushroom shaping operation, thus in some cases permitting thinner sheet to be used. The added layer may be pre-treated on both faces with a tacky material to first secure them in position during assembly and second to capture and retain large particles in use.

In the case of press or blow formed sheet made with non-crystalline material, where hard scraper edges are required, a layer of hard yet flexible aperatured sheet or net may be added across the rubbing surface, but some slack is needed to ensure this does not excessively reduce flexibility. This outer layer is bondable by thermal or chemical welding or adhesive bonding near the centre of the top of each protrusion, thereby spanning and enclosing the space between protrusions.

In the course of development a second manufacturing approach was developed using a single operation employing blow forming with vacuum assistance, which was found to be cheaper. This produces an asymmetric formed polymer sheet with mushroom shapes with rectangular stems and rubbing faces, including rhombic close packed faces on one side of a sheet only. This approach has the advantage of being easily automated for high volume production. This is referred to hereinafter as blow forming although it is understood this may include vacuum forming or some combination of these.

Blow forming provided formed sheet with functional benefits as a result of crystallisation during blow forming; resulting in exceptionally hard sharp scraping edges on both PE and PP formed sheets when formed over a shaped wire matrix. The wire matrix is constructed with a series of bent lengths resembling sine waves with flats ground at the contact points. The wires held tightly together during forming and then relaxed after cooling to facilitate easy withdrawal of the overformed sheet as illustrated later.

The forming sequence of the sheet is first to heat it to its plastic condition by hot-plate, warm air or HF radiation using industry standard practices, then placing it in contact with wire matrix and forcing by blowing or sucking the softened sheet through the holes in the matrix. The polymer extrudes straight and parallel through the gaps in the wire matrix. Beyond the matrix is placed a flat warm die and as the growing protrusion reaches this it starts to spread laterally and therefore spreads around the wires thereby forming mushroom shapes with spread tops and creating reverse curves or tapers in the mushroom stems. By control of the shape of the wires and their relationship with the flat die it was found this approach had the significant advantage of trapping the outer periphery of the spreading head between the flat die and wire matrix, thereby densifying the rim of each rubbing face on PE and PP sheets, creating a hard and if desired a sharp edge. Furthermore it was found the extruded stems became significantly stiffer during plastic extension, while the centre of the mushroom heads were substantially thinned to about 25% of the starting thickness during spreading and appear soft possibly due to bi-axially relaxation. The mushrooms formed over a wire matrix have relatively larger rectangular section stems, which are stiffer than the circular stems formed on press tooling as illustrated with diagrams later.

In use, and especially when using resilient rubber like materials, each mushroom acts like a coil spring standing on end, with their end face aligning with the work-face. As rubbing starts the mushroom body bends and deforms thereby storing energy, the amount depending upon the friction between the aligned face and surface being treated. At some point the reaction force of the sprung mushroom form overcomes the friction resistance between face and surface, which causes the body to spring forward. Thus there are numerous uncoordinated micro oscillatory motions when rubbing with a formed sheet, the amplitude of the oscillations being determined by local mechanical conditions and the resilience of the sheet material. Under more controlled conditions such as mop heads these oscillatory motions tend to synchronise and create standing waves, which are highly beneficial in specialised cleaning operations, having the effect of opening and closing the gaps between mushroom heads, which improves particulate pickup.

The invention is now described further with reference to the following diagrams:

FIG. 13 shows a schematic layout for the manufacture of asymmetric thermoformed sheet with a single blow or vacuum forming operation.

FIG. 14 shows round tooling wires used for the thermoforming in FIG. 13.

FIG. 15 shows open and closed up triangular tooling wire joined into a chain.

FIG. 16 shows XS of sheet between dies with triangular wires before forming.

FIG. 17 shows XS of sheet between dies after forming around triangular wires.

FIG. 18 shows XS of single sided sheet of FIG. 17 removed from forming tools.

FIG. 19 shows XS of double sided blow formed sheet in tooling after forming.

FIG. 20 shows XS of double-sided sheet of FIG. 19 removed from tooling.

Figure 1:
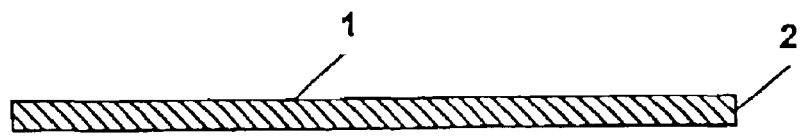
FIG. 1 shows a cross section (XS) of a sheet, either metal or polymer before extruding.

FIG. 1 shows a section of a continuous sheet 1 extruded and reduced to the desired thickness 2 typically in the range 0.1 to 1 mm, of which 0.4 was found to be suitable for a general purpose domestic cleaning sheet made in LDPE material. The width of the sheet was limited in practice by the tooling, to between 200 and 300 mm, however that can be increased.

Figure 2:
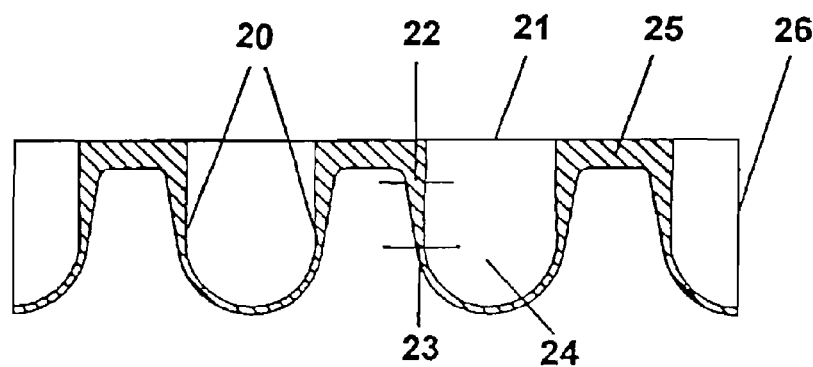
FIG. 2 shows a XS of a row of asymmetric protrusions extruded by a first forming of the section of sheet shown in FIG. 1.

FIG. 2 shows a section through typical formed protrusions either deep drawn metal or vacuum-formed polymer 20 on one side only. The protrusions shown were made 3.6 mm inside diameter 21. The outside diameter was about 4.7 mm at the base 22 tapering to about 3.6 mm at 23 and domed at its end 24. The overall external height of the protrusions 26 is 4.88 mm. The protrusions are coupled by unformed material 25 referred to hereinbefore as a "web".

Figure 3:
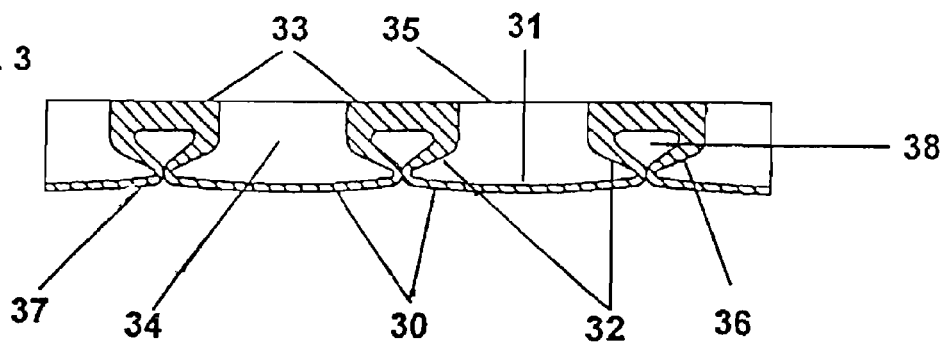
FIG. 3 shows XS protrusions of FIG. 2 after second forming into inverted mushrooms shapes with slightly curved almost flat heads.

FIG. 3 illustrates how the protrusions appear after compressing in a second forming operation to form a series of close spaced mushroom shaped heads that collectively form the operable rubbing face 30. For metals this second forming is done by pressing with a flat die while maintaining internal air pressure. For polymers a plate heated to just above the melt level is pressed against protrusions that are preheated to just below the melt level. The face of the plate is treated with release agent to prevent adhesion. To control the shape of this section during thermo forming it is beneficial to press faces 33 against a flat tool to form a seal to prevent air escaping during forming. It is even more beneficial to apply a slight positive pressure of about 0.15 bar to ensure the mushroom shapes 36 form consistently, as shown by the cross-section view of the void volume formed 34 with orifice 35. The result in both cases is a nearly flat slightly sprung domed section 31 supported by stiffer walls 32 and a stiff fold at the periphery of the dome 37. Space 38 between mushrooms becomes a labyrinth between mushrooms into which dirt is channelled and retained.

Figure 4:
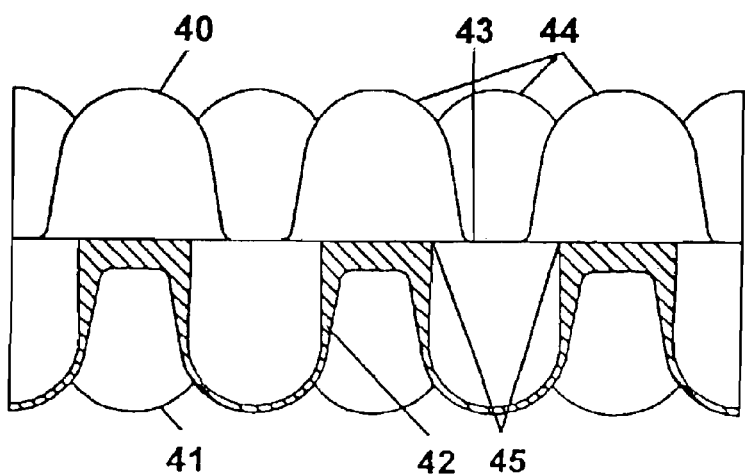
FIG. 4 shows XS of symmetric multiple rows of formed protrusions.

FIG. 4 illustrates a section view of symmetrically thermoformed sheet with offset protrusions 40 formed on the upper face as well as more on the lower face 41. Thus both sides of the web are covered with symmetrical arrays of protrusions in which the orifice 43 of any protrusion is surrounded with four protrusions 44 on the reverse side. These protrusions were deep drawn on metal and vacuum formed on polymers—both sides simultaneously. Typically about 65% of the web area is used to form protrusions as shown in 3D in FIG. 9 whereas the protrusions when formed into mushroom shapes as in FIG. 5 actually overlap about 80% of the sheet area as shown in 3D picture FIG. 10. If a rectangular form is used instead of circular then the overlap may approach 95% due to improved rhombic packing. Although not shown, before second forming of the protrusions, the web material surrounding the orifices 45 can be further formed to reduce the orifice diameter 43, thereby to act as a metering orifice.

Figure 5:
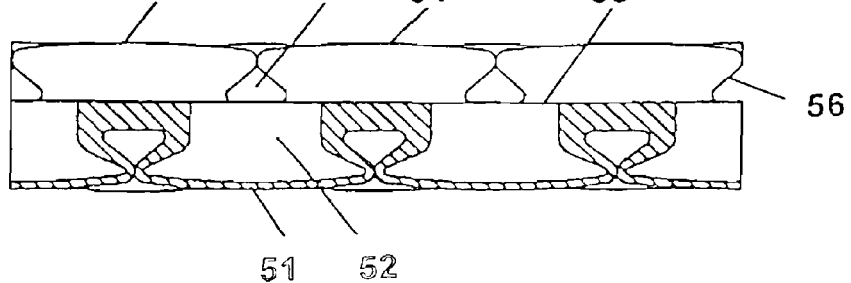
FIG. 5 shows XS of protrusions of FIG. 4 after second forming into mushrooms.

FIG. 5 illustrates the double-sided formed sheet 50 after a second forming and how it reduces overall height (z dimension) and create mushroom shaped rubbing elements shown externally at 54 and in cross section at 51. Thus scraped up dirt displaced by rubbing elements 50 and 54 and their complementary pair (not shown) on the upper face, can penetrate between the mushroom domes into a labyrinth 53, and is further able to access the cavity 52. The web face 55 and the lower side walls of the protrusions 56 may be treated with an tack substance, a contact adhesive, for example a thin sheet of adhesive that retains high tack, to improve the entrapment and retention of large particles.

Figure 6A:
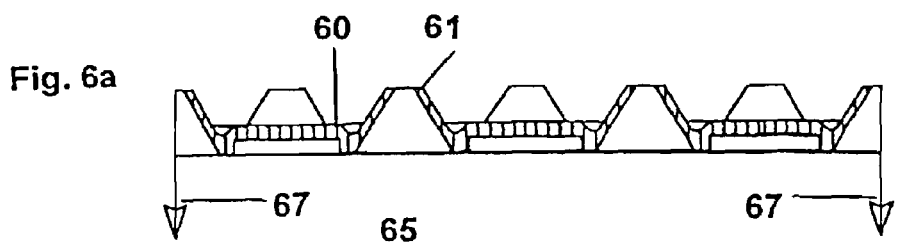
FIG. 6a shows XS of a further layer to be added onto upper or first face.
Figure 6B:
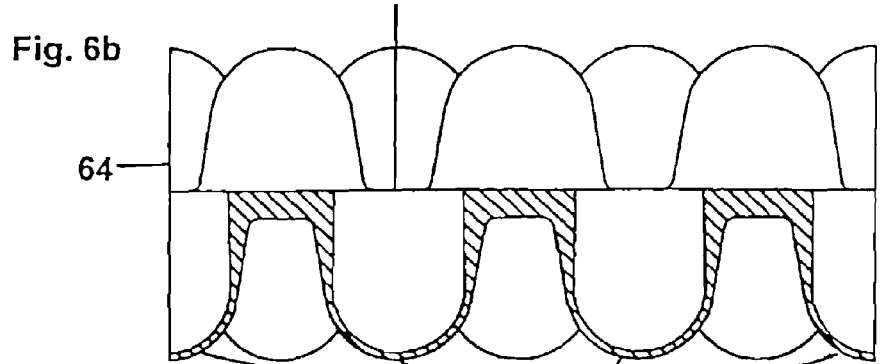
FIG. 6b shows XS as in FIG. 4 ready to further layers before second forming operation.
Figure 6C:
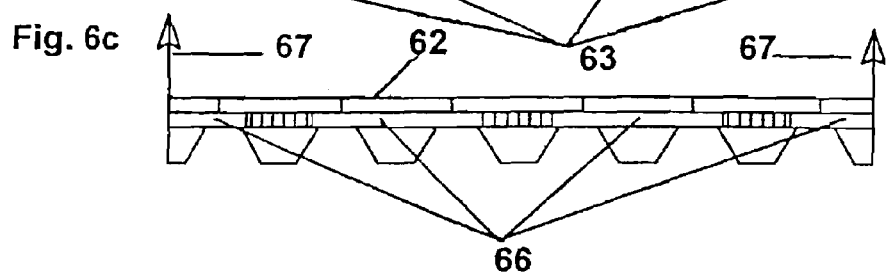
FIG. 6c shows XS of a further layer to be added onto under or second face.

FIGS. 6*a* and 6*c* are cross-section views of two further layers 60 and 62 that are formed sheets to be added to first formed sheet 64.

FIG. 6*b*—The formed sheets of FIGS. 6*a* and 6*c* are moved in the direction of the four arrows 67. The further layers are pierced 66 to slip over protrusions 63 and align the formed nozzles 61 over the orifices of the inverse cavities 65. The further layers may perform a variety of functions, those shown provide formed orifices 61, but the layers can also be used to selectively seal off cavities to provide buffers; or add tapered stiffening rings that locate around the mushroom stems; they may add scrapers of harder material that locate just below the flat heads.

Figure 7:
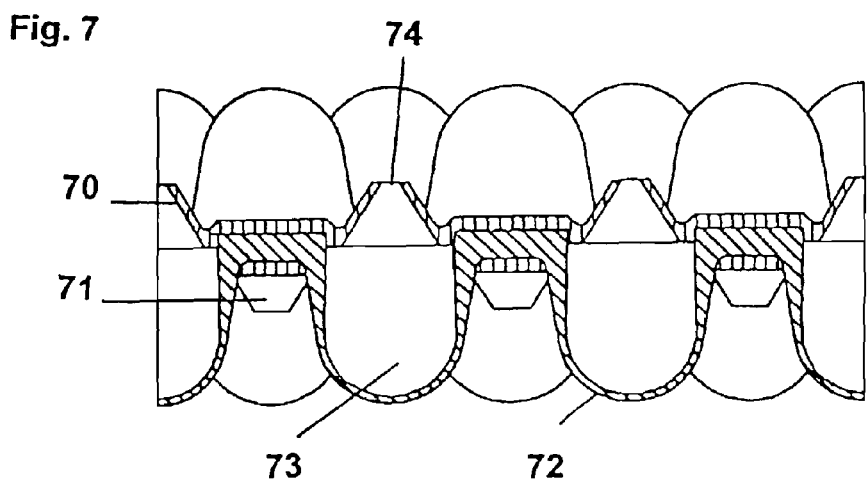
FIG. 7 shows XS of added layers slipped over protrusions.

FIG. 7 shows the further layers 70 and 71 (shown in FIG. 6*a* as 60 and FIG. 6*b* as 62) forced into position over the protrusions 72. The formed orifice 74 aligns over cavity 73 to control fluid release.

Figure 8:
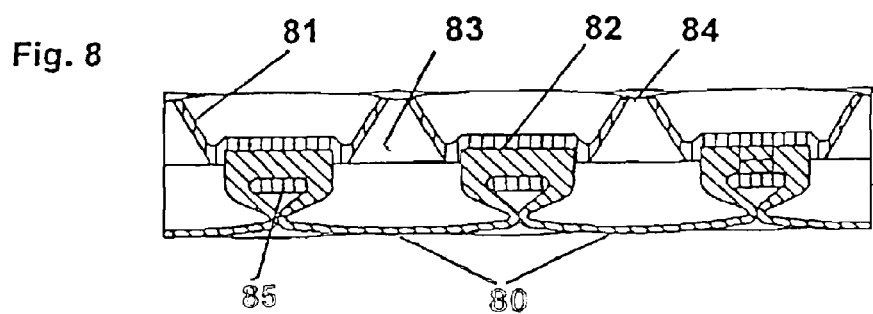
FIG. 8 shows XS of added layers secured by second forming of protrusions into mushroom shapes.

FIG. 8 shows the assembly of FIG. 7 after second forming. The mushrooms 80 having spread laterally trap the further layers at underside 85. The shaped nozzle 81 nestles between four mushroom heads, effectively enlarging the cavity 83 and sealed over the flat surround and web face 82, each orifice placed between four mushroom faces without blocking labyrinth.

Figure 9:
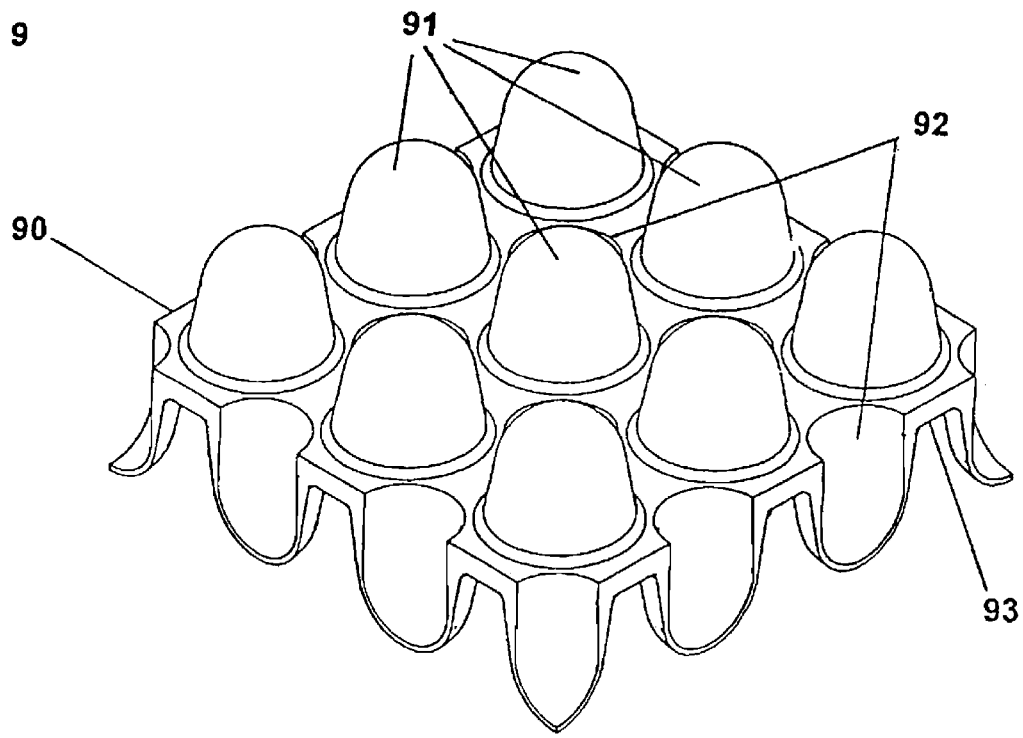
FIG. 9 shows a three dimensional (3D) view of FIG. 4

FIG. 9 is a 3D view of a section of a web 90 after a first forming shown in cross section in FIG. 4. The protrusions 91 are interspersed with the orifices of the protrusions on reverse side 93.

Figure 10:
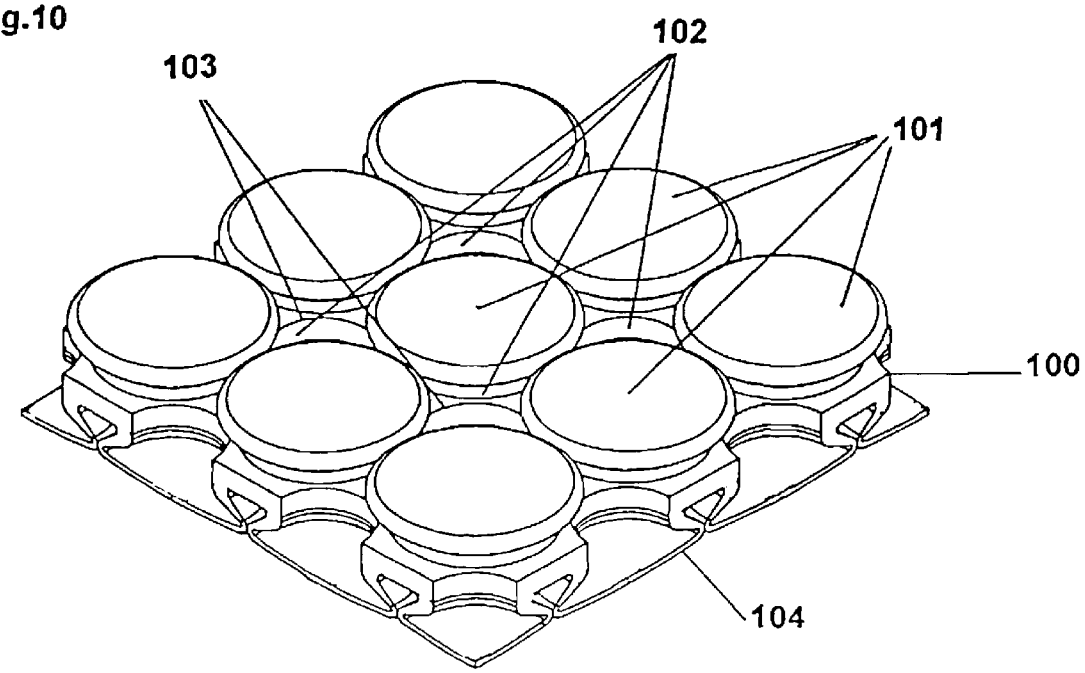
FIG. 10 shows a 3D view of FIG. 5

FIG. 10 is a three-dimensional view of a section of a web 100 shown after the second thermoforming operation (previously shown in cross section in FIG. 5). Individual mushroom heads 101 combine to provide an operable rubbing face interspersed with apertures (gaps) 102. At the centre of each gap is an orifice into a cavity 103 on the reverse face within matching mushrooms on the reverse side 104.

Figure 11:
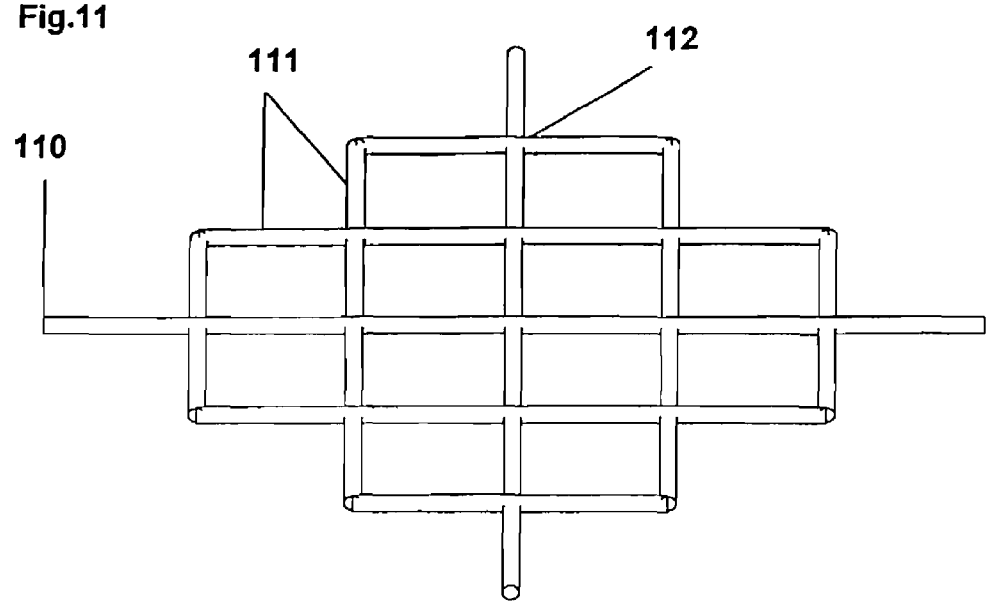
FIG. 11 shows a straight-corded net for use as an outer scraper layer.

FIG. 11 shows a straight cord net 110, constructed by means similar to nets used for horticultural purposes, where strands 111 are individually extruded, crossed 112 and welded on high speed special machines. The pitch of the crossings matches the pitch of the mushroom faces. The actual cross section of the strands is shown round, but may in practice take virtually any form that improves its scraping or rubbing action in. Examples of other forms include rectangles, triangles, hex-angles or some combination of these straight as single strands or twisted multi-strands.

Figure 12:
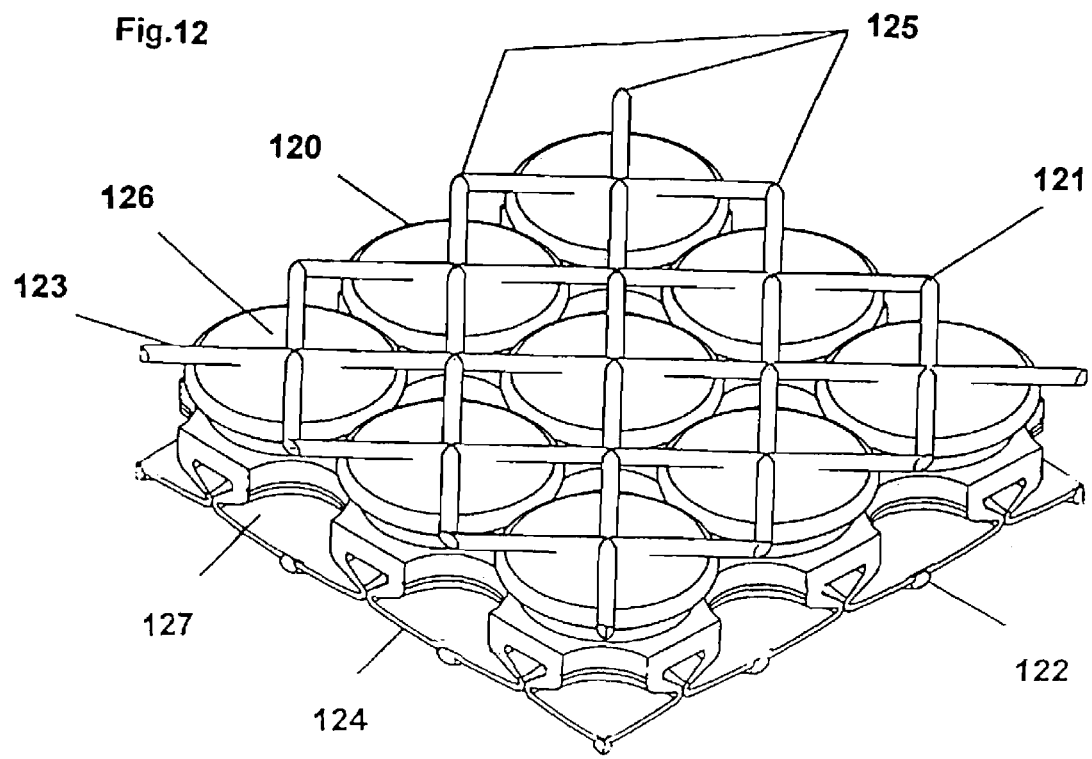
FIG. 12 shows scraper nets attached to both sides of the wipe core of FIG. 10

FIG. 12 shows a formed sheet 120 bounded by an upper net 121 and a lower net 122. Whilst the net shown symmetrical with similar intersection pitch to the mushrooms, it is evident this might be any multiple of the spacing either with nets having more or less cords. It is possible to vary the spacing of the cords to optimise function; spacing 125 may be regular or irregular. The net 121 is shown oriented at 45° to the sides 124, which provides limited flexibility because the rectangular net form can concertina, while the wipe returns to its rectangular form by a cross bracing action.

FIG. 13 shows a schematic diagram of equipment for producing a low cost asymmetric formed sheet in an automatic manufacturing process. This provides formed sheet carrying an array of mushroom shaped protrusions in thin sheet made with a single thermoforming operation-using blow and/or vacuum forming or a combination of both. Mushroom shaped protrusions are difficult to form in a single operation and once formed are difficult to release from the tooling. This is overcome by using a chain like looped tool 130 comprising a series of formed wires as shown also in FIGS. 14 and 15, 145 and 150 tied at their edges by sprung loops 154 and 156, hence the chain is stretchable. The chain 130 is fed via tensioning rolls 131 between heated forming dies 132. Back rolls 134 ensure the wires within the chain, which at this stage are running in guides at either side, are held tightly pressed together to form an aperatured matrix (grid) as shown in FIG. 15.

The sheet to be formed is fed from role 135 over a heating plate 133 and into the forming area 136. FIG. 16 shows a cross section of the sheet positioned under the wire grid before forming area and FIG. 17 shows the same cross section after forming. If the top forming die 132 is flat and not embossed and means are provided for preventing the formed sheet adhering to the under face of 132 the process can be continuous, otherwise a pause is required to allow the sheet to recover strength before separating from die and indexing. Means for preventing adhesion can be either a non-stick surface or the use of sheet material that is amenable to dielectric heating, since the tools stay relatively cool with dielectric heating the polymer materials are less likely to adhere. An alternative die construction that is worth mentioning, but is not shown, is to use large diameter roll dies which are rather expensive to tool but do have the potential to provide a continuous process at high volume for embossing the mushroomed rubbing faces.

After forming, the sheet passes through an optional cooling area 137 into a second operation welding stage 139 where a backing sheet is fed from roll 138 and is attached while the wires are still available to give support. Although not shown, an automatic filling station can also be added at 137 providing the sheet is formed or positioned with its opening facing upwards, which is the reverse of what is shown. The formed sheet 140 then cools as it passes towards and between two splitting or 'unzipping rolls' 141 and 142. The wire pitch is also relaxed so that as the formed sheet bends round 141 the gaps between the mushroom shapes on the formed sheet open to release the wires and allow the wire chain to be withdrawn upwards over roll 142, rather like a zip being undone. Roll 141 needs to be a fairly tight radius of less than 15 mm for clean separation. The temperature of the formed sheet at separation should be less than 50° C. It was found the chain splitting roll 142 could actually accommodate a larger radius of more than twice that of the sheet splitter roll 141. The tool chain then feeds back across span 143 through tension management rolls 144 and the circuit is complete.

FIG. 14 shows examples of the formed wires 145, typical of those used suspended between ties 154 in FIG. 15 running each side to form a chain for use in the schematic shown in FIG. 13. The formed wire shown 145 is round and ground semi-circular 146 where the wires touch at faces 147. The pitch of the waveform determines the size of the orifice and typically the pitch used varied between 5 and 10 mm and the amplitude were typically 2 to 4.5 mm. The diameter of the tool wires ranging from 1 to 2.2 mm. Looped multi-strand wires 152 brazed to the tool wires made effective chains.

FIG. 15 shows an alternative wire form 150 with a triangular cross-section 151 and with a radius on edges 152, shown more clearly at 162 in FIG. 16. The shape of the wires determines the shape of the formed mushroom stems and labyrinth space used for collecting and retaining dirt as shown in FIG. 17. The wire shape also influences the angle of fold at the periphery of the mushroom face and especially densifying and work hardening when using crystalline materials as well as forming a sharp scraping edge. The wires have flats ground on them at their contact regions 153 to provide packing uniformity when the wires are pushed together as shown at 157 ready for blowing or sucking softened sheet up through holes of the closed grid 158. The wires are joined into a chain with loops 154 that allow the wires to spring open by a gap 155 with the wire loop as shown at 156 to facilitate separation from the over formed sheet.

In FIGS. 16 to 20 the cross sections of the sheet are shown solid to make it easier to distinguish the formed materials against the forming tools.

FIG. 16 shows a cross section view of the sheet 160 before forming placed on top of the lower die 161 as it enters the forming area 136 in FIG. 13. Triangular wires 162 are located above the sheet 160 resting against the upper die 163. The blow pressure is applied via port 164. Micro-roughness introduced at the die surface 165. Vacuum forming ports 166 are used to draw material into conical micro protrusions 167. If convection heating is used the upper die 163 is heated as well as 161, the wires 162 also become hot all held close to the transition temperature between elastic and melt phases.

FIG. 17 shows the same cross section after forming. The material under the wire 170 is not formed initially. The material in the radius 171 progressively thins as it extrudes, the tendency is for the sheet to extrude straight up and thin. As it reaches the top die at 178 so the material spreads laterally driven by compressed air moving in the direction of arrows 174, until it fills the corner 172. A sharp edge is formed at 175 as the material is driven into the junction of the wire and die, and a nip develops that tends to densify the sheet material at this point. The thickness of the top face 173 was found to be typically 25% that of the original sheet. The formed protrusion 176 with cavity 177 has now assumed the desired mushroom shape. Upon completion of lateral spread a vacuum is applied 179 to draw micro protrusions 182.

FIG. 18 shows a section of formed sheet with mushroom like protrusion 180, formed in the tool shown in FIG. 17. The stem wall 181 thin as they extrude but may in the case of PE and PP actually stiffen due to crystallisation. The porosity cones 182 stand above the micro-roughness on the rubbing face so they are easily fractured upon initial rubbing to create a porous surface. The width of the stem 185 is less than the flat head 186. A backing sheet 183 is bonded onto the flat 184 to create a sealed cavity 187. The labyrinth 188 is accessed via gap 189.

FIG. 19 shows an alternative tool arrangement for shaping double sided single layer tools. Generally this tooling works like that in FIGS. 16 and 17 with the addition that after blow forming the mushroom shape with compressed air 195 the bottom die 190 moves upwards in the direction 191 to squeeze material laterally in direction of arrow 193 to push out radius 194.

FIG. 20 shows a cross-section of sheet formed in FIG. 19, the laterally displaced material at 200 creates a shape similar to 201 but the radius 206 is larger than 207, which can actually be a sharp edge. The formed sheet is a tool with similar forms on both faces except for the cavities 202 are separate on the underside and the labyrinth 203 is interlinked across the sheet on the upper face which is shown in 3D in FIGS. 21 and 22. Micro-roughness is added at 204 and not 205. Micro-roughness may be added in any combination between the faces 204 and 205. The shape of the micro-roughness can be varied to suit the application, the sine wave shown being a general-purpose shape. For clarity the micro roughness illustrated is a lateral pattern but this can impede lateral flow, to improve forming the all tool surface roughness should be orientated in the direction of the flow. Thus the preferred rubbing face micro-roughness pattern is a radial pattern.

Figure 21:
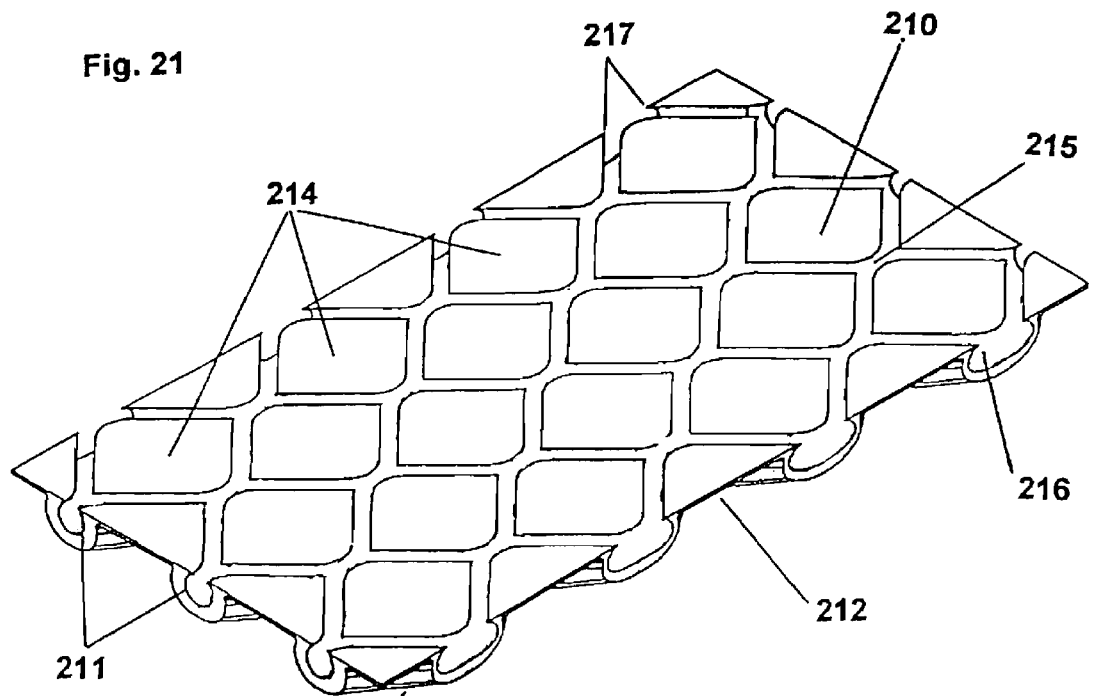
FIG. 21 shows a 3D view of single sided formed sheet removed from tooling.

FIG. 21 shows a three-dimensional view of the operable face of a sheet with an array of close spaced rubbing faces that approximate to a rhombus. These are mushroom like flat protrusions with flattened heads 210 supported by reverse tapered or concave stems 211 and with the head 210 being broader than the stem 211 leaving a cavity 212 opening onto reverse side 213. The flat tops 210 some with porosity comprise the operable face 214 interrupted by apertures (gaps) 215 providing access into a labyrinth 216 below the operable face 214. The labyrinth 216 being accessible from the operable face so that dirt scraped up by the sharp edges of the heads 217 is directed into the labyrinth where it becomes entrapped either by closeness of heads or tack in labyrinth.

Figure 22:
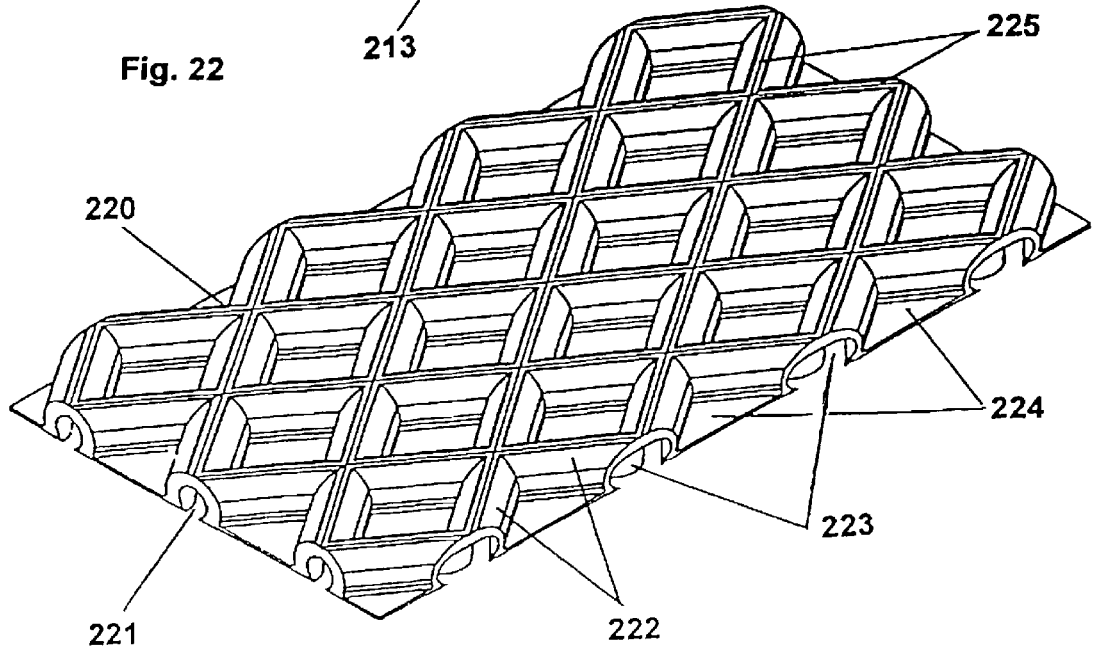
FIG. 22 shows a 3D view of reverse side of sheet formed over round wires.

FIG. 22 shows the reverse side 220 of the formed sheet shown in FIG. 21. This sheet was formed over round (circular section) wire resulting in a circular labyrinth 221, creating a grid of tunnels 222 spanning the sheet which is the interlinked labyrinth space 223, interspersed with cavities 224.

The small flat section at the top of the arching labyrinth 225 is unformed and this material retains the flexibility of the original sheet when using crystalline material. The unformed areas 225 link up across the sheet maintaining a flexible web of material after forming.

Figure 23:
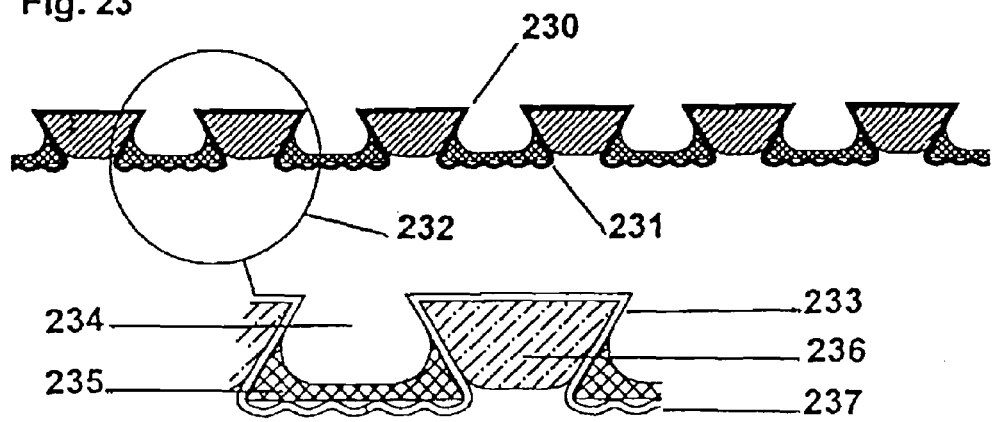
FIG. 23 shows a XS of a single layer sheet for cleaning and wax polishing.

FIG. 23 shows a cross section of a single layer blow formed sheet with two operable surfaces formed asymmetrically about the sheet but in a virtually symmetric shape. This is cleaning and polishing sheet and manufactured as detailed in FIG. 17. A sheet is formed with sharp edge mushrooms 230 on one side and rounded edges 231 on inverted mushroom forms. For clarity the section in circle 232 is expanded in 233. The top or first face has sharp edges used for cleaning by scraping dirt into the labyrinth 234, like dirt and mud off shoes. The bottom of the labyrinth is treated with tacky wax oil 235 that semi solidifies and remains trapped in the labyrinth due to the wedge like structure, and this tack surface and the tapered shape that captures and hold scraped off dirt, the actual size of the opening into 234 being chosen to suit the application. On the second side the cavities are filled with a semi solid wax like polish 236, like shoe, floor or furniture polish. The polish being dispensable from open cavities under operable pressures during rubbing and transfers onto the surface and is rubbed in by the finely embossed reverse faces 237. Thus the formed sheet is first used to scrape a surface clean and then reversed to polish the cleaned surface.

Figure 24:
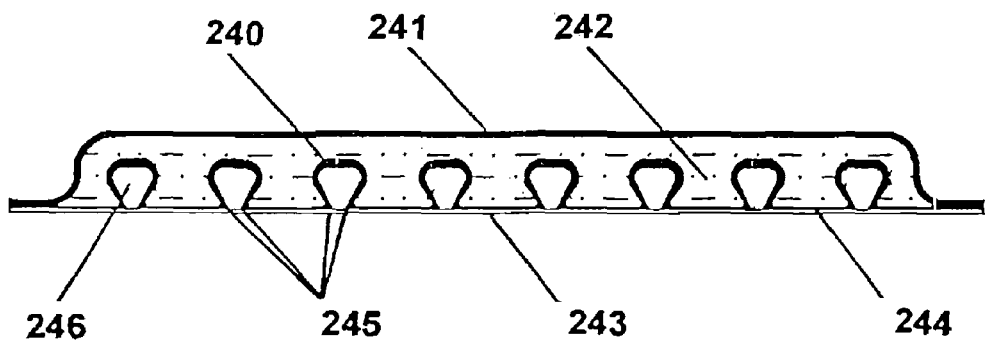
FIG. 24 shows a XS of a flat-formed sheet incorporated into barrier sachet.

FIG. 24 illustrates another practical use for the formed sheet as a surface treatment tool. It shows a cross section view of a flexible formed sheet 240 that was formed over triangular wires, the formed sheet acts as the front of a flexible sachet with backing 241 filled with a liquid 242. Across the front of the rubbing face is a membrane 243. The sachet 241 and membrane 243 may be made with materials of low gas permeability barrier materials thereby protecting the fluid during long periods of storage (shelf life). The front membrane may be peeled off to reveal the rubbing face. The flat mushroom heads 244 are porous so that upon rubbing fluid is released and spread, which is then scraped up by the edges 245 and held with the labyrinth 246. The peel off membrane uses similar adhesive technology as used in food packaging, for example yoghurt pot lids.

Figure 25:
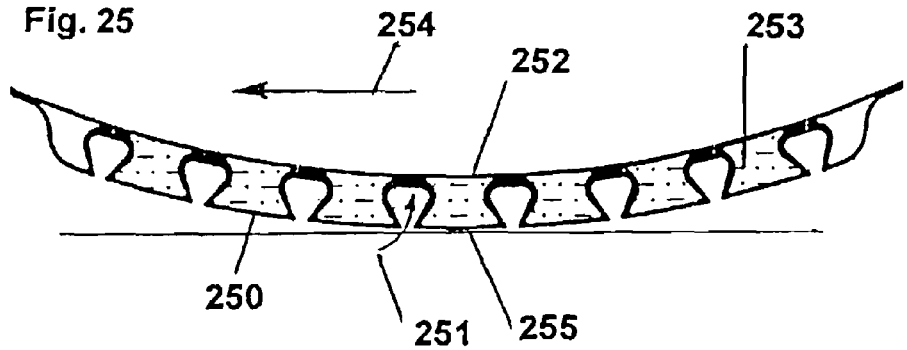
FIG. 25 shows a XS of a formed sheet curved to improve particulate pick up.

FIG. 25 is a further example of the usefulness of the formed sheet as part of a flexible cleaning aid 250 in which the individual cavities are sealed with a backing sheet 252. The tool is shown curved to improve dirt collection 251 in the direction of the arrow when rubbed in the direction of arrow 254. Again the cavities 253 are filled with cleaning fluid that is slowly released upon rubbing via porous front face 255.

Figure 26:
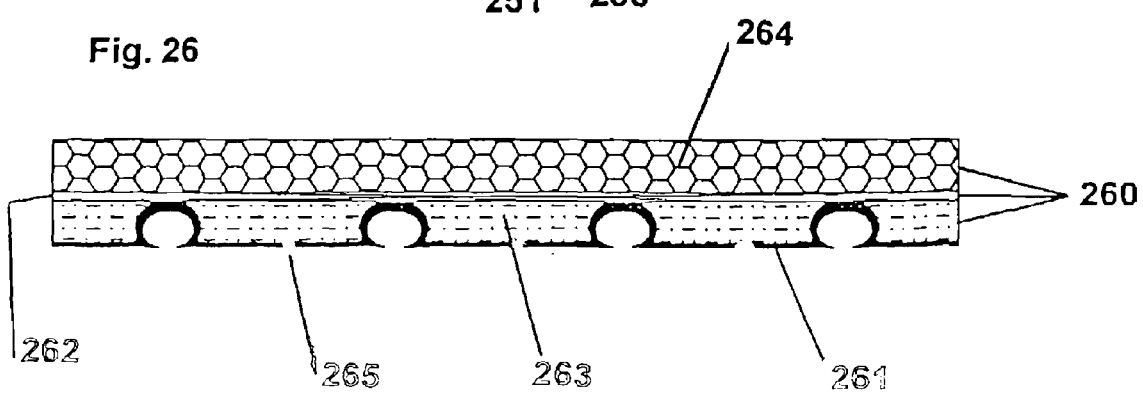
FIG. 26 shows a XS of formed sheet filled with fluid sealed with back-seal and with foam backing added for drying.

FIG. 26 is a further example of a use of the formed sheet, where it is used in a triple layer composite flexible tool 260. In this case the formed sheet 261 has a backing sheet 262 to seal off the reverse side cavities, the cavities filled with fluid 263. The fluid is released via orifices 265 in the rubbing faces of the formed sheet during initial rubbing. A sheet of sponge cloth 264 is attached to the backing sheet for drying after rubbing.

EXAMPLES

The following examples compare the performance of tools using circular and rhomboidal shaped protrusions with conventional non-woven wipes for collecting up particulate matter. Three representative types of polymer material were used for the tools as follows:

1. A low cost general purpose 'blown' low density PE sheet
2. A low cost general purpose PP/PE blended copolymer sheet
3. A plastic/rubber soft touch hybrid TPU (thermo-plastic urethane)

Tool Set 1 used to make the circular protrusions comprised a heated die set with the protrusion shapes cut and polished therein for drawing protrusions by vacuum one or both sides simultaneously. A second operation with a flat heated die was used to iron (squash) the protrusions into mushroom shapes.

Tool Set 2 employs a shaped wire grid generally as described with reference to FIGS. 13 to 19 and employs only one forming operation.

Example 1

To Vacuum Draw an Array Use First Tool Set

Test 1—Preparation: A 150 mm square 0.3 mm thick sheet was cut from general purpose LDPE blown film marked as grade 118 W branded SABIC™, a trade mark of SABIC™, a trade mark of SABIC EuroPertochemicals Company, Poststraat 1, 6135 KR Sittard P.O. Box 5151, 6130 PD Sittard, The Netherlands. The material believed to have a Flexural Modulus between 200 and 600 $N/mm^2$. The cut sheet then placed between dies in Tool Set 1 and heated to 127° C. and the dies closed and left for 1 minute. The dies being of polished aluminum with recesses machined 3.5 mm deep overall with domed head and 3 mm diameter, and placed on 4.5 mm centres. A vacuum hole was placed at the top dead centre of each recess.

Test 1—Stage 1: An appropriate partial vacuum was drawn and maintained while the platens were cooled to about 75° C. The vacuum was released and the platens opened. The preform was removed from tooling at about 25° C. and was as shown in double-sided format in FIGS. 4 and 9.

Test 1—Stage 2: The PE pre-form was placed in a second set of flat dies of Tool Set 1, which had spring-loaded sliding tubes that were aligned over and sealed against the cavity orifices on both sides. The tubes acting to support the preform suspended equally between two flat and heated platen faces. A small positive pressure of 0.5 bar was applied inside the cavities via the supporting tube to blow the softened material outwards to form a mushroom shaped head as the gap between the dies was slowly reduced to flatten the protrusions into mushroom shapes as shown in FIGS. 5 and 10.

Test 2: The procedure was repeated using a PP/PE copolymer cast material 0.3 mm thick, comprising three layers of 0.1 mm sheets cross oriented to simulate biaxial conditioning, of similar dimension but the processing temperature was raised to 165° C. The material used was marked PPKA1 supplied by Flexico Group, I Route de Meru, Henonville, 60544 Meru Cedex, France and believed to posses a flexural modulus of typically 1500 N/mm2.

Test 3: The procedure was repeated with TPU sheet branded Walopur™ 4201 supplied by Epurex Films Gmbh & Co. KG P.O. Box 1652, 29656 Walsrode Germany and described as highly elastic polyurethane ether sheet with a quoted density of 1.15 $g/cm^3$. The sheet thickness was 0.4 mm and the processing temperature 170° C., Shore A-hardness was quoted at 87.

Results

The above formed tools were evaluated against non-woven wipes for durability and picking up dirt containing particulate matter.

Test I: LDPE produced a moderately stiff formed sheet, comparable in stiffness when flat to a flat 100 gm writing paper and uniform. The thickness of the mushroom tops was on average 0.1 mm and their overall upstanding height typically 1.3 mm. The stems of the mushrooms became moderately stiff—attributed to the combination of the tubular form and material strengthening by crystallisation, individual mushrooms being stiff enough to compress no more than 10% when subjected to a force of 0.25 Newton. The rims of the heads became stiff but the faces of the mushrooms remained soft and pliable because they had thinned. Upon crumpling up into a ball by hand the compressed volume of the formed LDPE sheet was about three times that of an equivalent non-woven wipe. Upon release the LDPE relaxed over a period of 30 seconds but retained about 10% set (slight unevenness but not tears or cracks) while the dry non-woven wipe also slowly relaxed but retained about 60% set after 30 seconds. Recovery of the formed sheet was unaffected by wetting with water but the non-woven wipe totally failed to recover when wet.

Test 2: PP/PE copolymer produced a stiffer sheet comparable in stiffness to *I 50 gm writing paper otherwise similar to test 1 above.

Test 3: TPU polyurethane ether produced a very soft sheet comparable in stiffness with a cosmetic face wipe. Upon crumpling up into a ball the compressed volume of the formed TPU was roughly double that of the wipe. Upon release the TPU instantly sprung flat with no permanent set while the non-woven wipe relaxed about 30% of its compression only when dry. Upon wetting with water all flexural stiffness was lost from non-woven wipe while non-was lost from formed TPU.

Example 2

Tool Set 2 Employed a Wire Grid in Die Set with Flat Dies

Test 4 Preparation: a 150 mm square 0.3 thick sheet of LDPE was cut from the same source as used in Example 1.

Test 4: the lower heated aluminium die had an air supply and diffuser located in a shallow recess approx 155 mm square and about 3.5 mm deep. A perforated sheet of aluminium 0.5 mm thick was cut to fit inside the recess to allow air to flow under the heated sheet. The sheet to be formed was laid into the recess on top of perforated sheet of aluminium and the wire grid placed over it as illustrated in FIG. 15—the wires being 2 mm thick and 154 mm long, and these rested on a ledge 2 mm down within the recess. A flat top die was closed onto the wires generally as illustrated in FIG. 19, but without micro-roughness. A slight positive pressure of 0.2 bar was maintained as the sheet temperature within the tooling rose to 129° C. The pressure was then increased to 1 bar for 30 seconds and then relaxed back to 0.2 bar while the tooling cooled. Upon removing the formed sheet the polymer had flowed over the wires (as intended) and these were released by releasing the ends of the wires and passing to formed sheet over a 15 mm roll, the bending action opening the formed shapes sufficiently for the wires to pop out.

Test 5: The procedure was repeated using a further sample of cast PP copolymer material as used previously in Example 1 and the test was conducted at a sheet temperature of 165° C.

Test 6: The procedure was repeated a third time using TPU sheet as tested in Example 1 and the test was again conducted at a sheet temperature of 170° C.

Results for tests 4, 5 and 6:

Test 4: Blow formed LDPE; this produced excellent over forms around the wires to give more squat rectangular protrusions with mushroom shaped cross-sections, similar to that shown in FIGS. 21 and 22. There was a hard peripheral edge around each mushroom head surrounding a soft flat rubbing faces. Overall the sheet remained almost as flexible as the original unformed sheet due to the relatively large unformed web. The stiffness and crumple behaviour was similar to Test 1.

Test 5: Blow formed PP/PE blend copolymer; it was found to be more difficult to blow form than PE because it has lower melt strength and a narrower process temperature window. However the samples produced showed significantly higher stiffness over similar PE samples with harder and sharper scraping surfaces, in fact it was observed on some samples to be hard enough to exfoliate skin and shear hair. It was noted the formed area was inelastic in both x and y directions with some small resilience in the z direction—attributed to relative softness of rubbing faces. The stiffness and crumple behaviour was less good than Test 4.

Test 6: Blow formed TPU polyurethane ether; this material blow formed very well and the detail resolution was excellent, indicating forms with much finer pitch can be achieved. The actual formed section was found to have considerably more elasticity than the surrounding unformed edge and this is a potentially useful feature as it provides a means of maintaining even contact pressure when rubbing complex shapes. It was also observed that the softness of touch is quite outstanding for dressing tender or sore skin, it having the considerable advantage of being able to scrape a wound and remover unwanted materials. The stiffness and crumple behaviour was similar to Test 3.

Functional Comparison 10 grams of dry silver sand was spread evenly over a flat wooden floor area of 0.1 m² representative of a typical domestic hard wood floor sealed with polyurethane varnish. A regular non-woven domestic floor mop sheet described as a disposable electrostatic cloth thought employ polyester fibres and to be carrying an electrostatic charge for attracting and collecting dust particles was folded to have a surface contact of 150 mm×150 mm and placed under a flat wood board under a 0.5 kg weight and rubbed with a single pass 300 mm long over the deposited material then checked for weight gain. A sample of each of the formed sheet was then subjected to a similar test. The tests were repeated with the test sheet mounted on a rounded base sweeping a radius of about 150 mm similar to that illustrated in FIG. 25. The sand pickup results were as follows:

|  | Flat dry pickup grams | Flat wet pickup grams | Curved dry pickup grams | Curved wet pickup in grams |
| --- | --- | --- | --- | --- |
| Non-woven | 0.003 | 0.01 | 0.02 | 0.03 |
| Test 1 | 0.09 | 0.60 | 0.24 | 0.7 |
| Test 2 | 0.04 | 0.09 | 0.45 | 0.55 |
| Test 3 | 0.18 | 0.41 | 0.21 | 0.49 |
| Test 4 | 1.26 | 1.95 | 2.12 | 2.8 |
| Test 5 | 1.65 | 2.21 | 2.35 | 3.01 |
| Test 6 | 1.74 | 2.90 | 2.48 | 3.09 |

Rubbed area was 0.45 m therefore maximum pick-up at 100% efficiency is 4.5 gram dry. Non-woven wipe efficiency 0.07%, Test 6 sample was 39% efficient. Thus the best results were obtained with blow formed sheet made with Tool Set 2.

The invention claimed is:

1. A surface-treatment tool comprising a flexibly-deformable sheet of non-absorbent material embossed with protrusions, each protrusion with an obverse side that constitutes a raised rubbing element on the face of the tool, and a reverse side bounding a cavity, the sheet being formed to have the shape of a closely-spaced array of similarly oriented hollow protrusions upstanding from either side of the sheet, the protrusions having mushroom-shaped cross-sections, each having a head that forms an apex of the cross-section and a stem that is narrower than the head, the protrusion forming cavities opening onto the reverse side and being fillable with a fluid, a solid, or a semi-solid, and such that the heads of the mushrooms comprise the operable face of the tool, while the interlinking space between the mushroom stems forms a sunken labyrinth running throughout the sheet accessible from the operable face and fillable with dirt.

2. A surface-treatment tool comprising:
a flexibly-deformable sheet having a closely-spaced array of a plurality of similarly oriented protrusions upstanding from either side of the sheet;
each of the protrusions having: (A) an obverse side which constitutes a raised rubbing element on the face of the tool; and (B) a reverse side that constitutes a cavity which is hollow and which opens onto said reverse side and is capable of being filled with stuff;
each of the protrusions also having a mushroom-like cross-section with head larger than stem thereof, wherein the surface of the head of the mushroom comprises said rubbing element and the operable face of the tool; and
an interlinking space: (a) which is positioned between the mushroom stems; (b) which comprises a sunken labyrinth running throughout the sheet; and (c) which is accessible from the operable face of the tool and is capable of being filled with other stuff.

3. A tool as claimed in claim 2 including operable faces on both sides of the tool.

4. A tool as claimed in claim 2 in which the operable faces are capable of aligning independently to the surfaces being treated.

5. A tool as claimed in claim 2 in which the interlinking space is accessible via gaps between the rubbing elements.

6. A tool as claimed in claim 5 including apertures between rubbing faces on the operable face through which scraped-up-stuff is capable of being passed during rubbing.

7. A tool as claimed in claim 6 including a tacky substance which is located on the surface of the interlinking space and which is capable of retaining said scraped-up stuff.

8. A tool as claimed in claim 2 in which the cavity includes a seal.

9. A tool as claimed in claim 2 wherein the shape of the face on the obverse side ranges from circular to rectangular, including a rhombic shape.

10. A tool as claimed in claim 2 in which the face of the obverse side has a stiff edge.

11. A tool as claimed in claim 10 in which the stiff edge includes a sharp cutting extremity.

12. A tool as claimed in claim 10 wherein the stiff edge comprises a material which is capable of softening if excessive friction-heating occurs during rubbing in order to prevent scratching.

13. A tool as claimed in claim 2 including micro-rough rubbing elements.

14. A tool as claimed in claim 2 in which the face of the obverse side includes a breakable micro-cone which is capable of being broken upon being rubbed to release fluid.

15. A tool as claimed in claim 2 in which the rubbing element is porous for dispensing stuff that may be contained within the cavity.

16. A tool as claimed in claim 2 in which a non-flowing wax-like material is positioned in the cavity and is capable of being dispensed onto the surface being treated through the opening on the reverse side of the protrusion as the surface is rubbed with the tool.

17. A method of forming a tool as claimed in claim 2 comprising selecting a sheet of thermo-formable polymer; heating said sheet; and subjecting the heated sheet to a pressure differential to blow or suck and extrude it through a body having an aperture such as to emboss the sheet with said protrusions.

18. A method of forming a tool as claimed in claim 17, in which the body comprises an array of touching shaped wires.

19. A method of forming a tool as claimed in claim 18, wherein the sheet is formed around said wires and the wires are left embedded in the sheet to support the sheet.

20. A method of using a tool as claimed in claim 2 in which a treatment is applied to a surface with an operable face of the tool during rubbing of the surface with the tool, the treatment including wetting the surface with fluid dispensed from the tool, then maximizing chemical-mechanical interactions at the wetted area by subjecting the wetted area to an agitating action which includes any of scrubbing, massaging, polishing, buffing, abrading, lapping, scraping, shearing, exfoliating and wiping.

21. A method for using a tool as claimed in claim 2 comprising treating the skin of an individual by massaging the skin with the rubbing elements of the tool by laterally applying pressure thereto and pummeling it with minute oscillatory stick-slip motions due to friction effects between the rubbing element and the skin.

22. A method for treating cellulite on the surface of the skin of an individual with the tool of claim 2 in which the cellulite is rubbed with the rubbing elements of the tool.

* * * * *